(12) United States Patent
Hatada

(10) Patent No.: US 8,427,628 B2
(45) Date of Patent: Apr. 23, 2013

(54) EXPOSURE APPARATUS, EXPOSURE METHOD AND DEVICE FABRICATING METHOD

(75) Inventor: Hitoshi Hatada, Sagamihara (JP)

(73) Assignee: Nikon Corporation, Tokyo (JP)

( * ) Notice: Subject to any disclaimer, the term of this patent is extended or adjusted under 35 U.S.C. 154(b) by 298 days.

(21) Appl. No.: 12/753,713

(22) Filed: Apr. 2, 2010

(65) Prior Publication Data

US 2010/0290019 A1 Nov. 18, 2010

Related U.S. Application Data

(60) Provisional application No. 61/297,331, filed on Jan. 22, 2010.

(30) Foreign Application Priority Data

May 12, 2009 (JP) ................................ P2009-115199

(51) Int. Cl.
*G03B 27/42* (2006.01)
*G03B 27/32* (2006.01)

(52) U.S. Cl.
USPC .............................................. 355/53; 355/67

(58) Field of Classification Search ..................... 355/53, 355/55, 67, 77; 356/399–401; 250/548
See application file for complete search history.

(56) References Cited

U.S. PATENT DOCUMENTS

| | | | | |
|---|---|---|---|---|
| 3,574,459 | A * | 4/1971 | Hartwig et al. | 355/66 |
| 4,103,991 | A * | 8/1978 | Kramer | 359/861 |
| 4,591,263 | A * | 5/1986 | Fergg | 355/43 |
| 5,657,130 | A * | 8/1997 | Shirasu et al. | 356/401 |
| 8,159,649 | B2 * | 4/2012 | Kato | 355/53 |

FOREIGN PATENT DOCUMENTS

| | | |
|---|---|---|
| JP | A 57-188065 | 11/1982 |
| JP | A 2007-114385 | 5/2007 |

OTHER PUBLICATIONS

International Search Report issued in International Application No. PCT/JP2010/057736 dated Sep. 7, 2010.
Written Opinion issued in International Application No. PCT/JP2010/057736 dated Sep. 7, 2010.
International Search Report issued in International Application No. PCT/JP2010/057736 dated Jul. 9, 2010.
Written Opinion issued in International Application No. PCT/JP2010/057736.

* cited by examiner

*Primary Examiner* — Hung Henry Nguyen
(74) *Attorney, Agent, or Firm* — Finnegan, Henderson, Farabow, Garrett & Dunner, LLP

(57) ABSTRACT

An exposure method for exposing a plate with an image of a pattern of a mask comprises: reciprocating the mask along X direction, synchronizing a movement of the mask and a movement of the plate to +X direction, projecting an image of a first pattern of the mask onto the plate as an erected image with respect to +X direction during a first period in which the mask that is reciprocating is moved in +X direction, and projecting an image of a second pattern of the mask onto the plate as an inverted image with respect to +X direction during a second period in which the mask that is reciprocating is moved in –X direction.

34 Claims, 18 Drawing Sheets

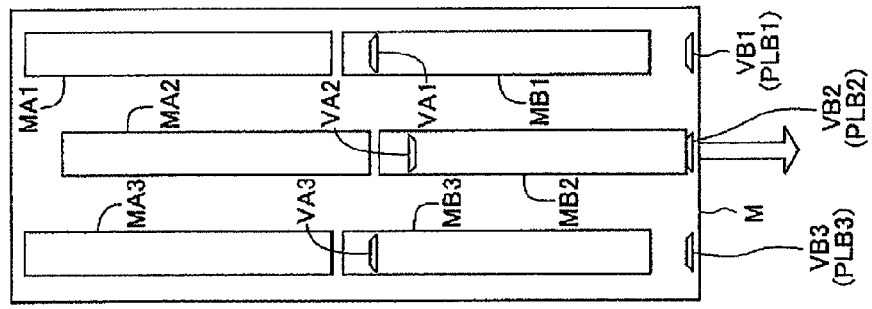
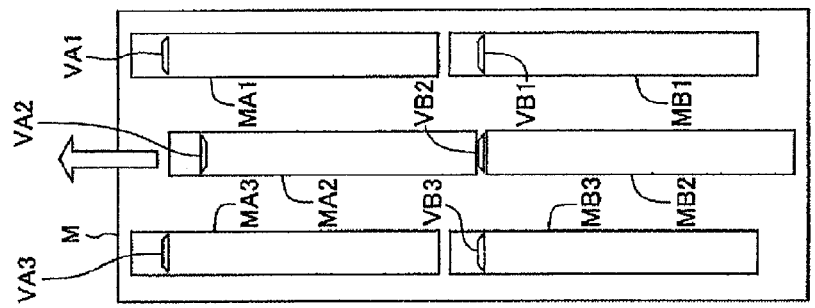
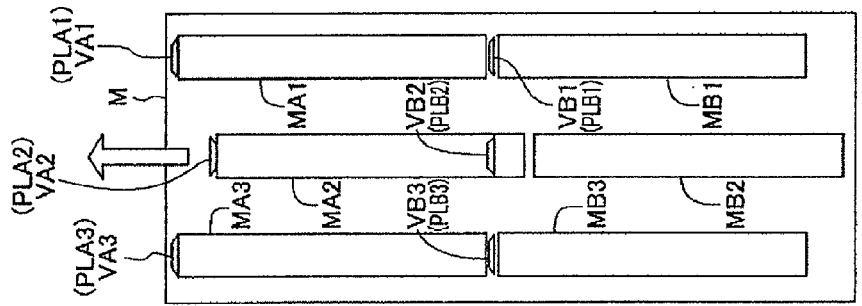
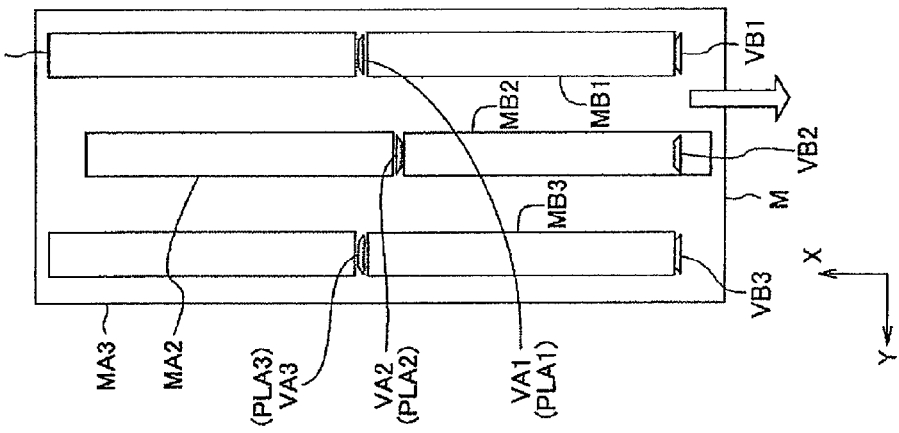

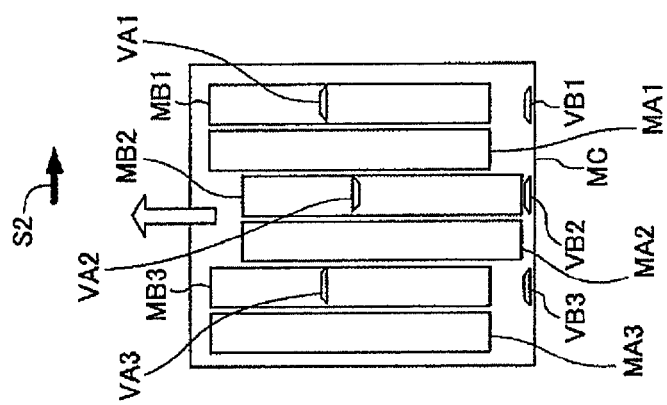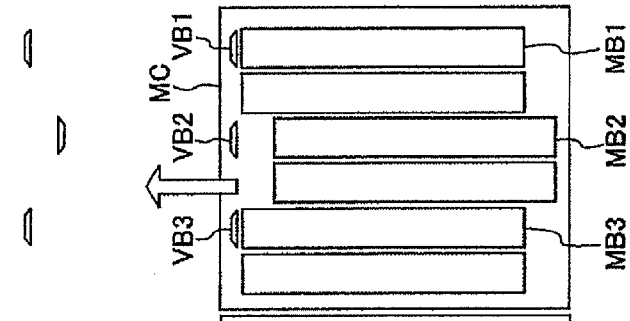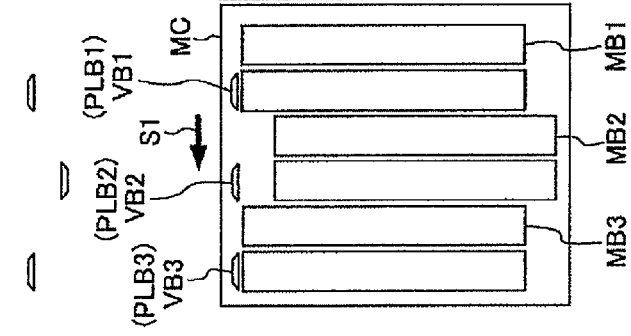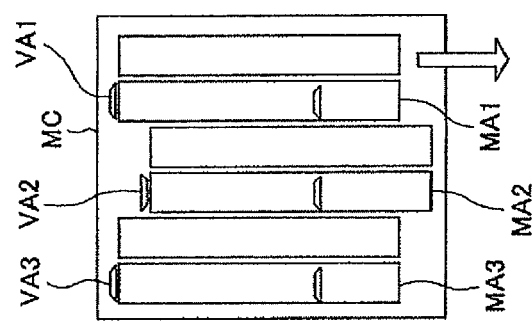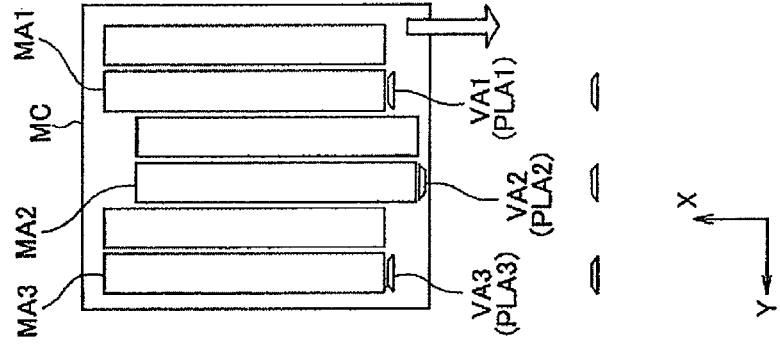

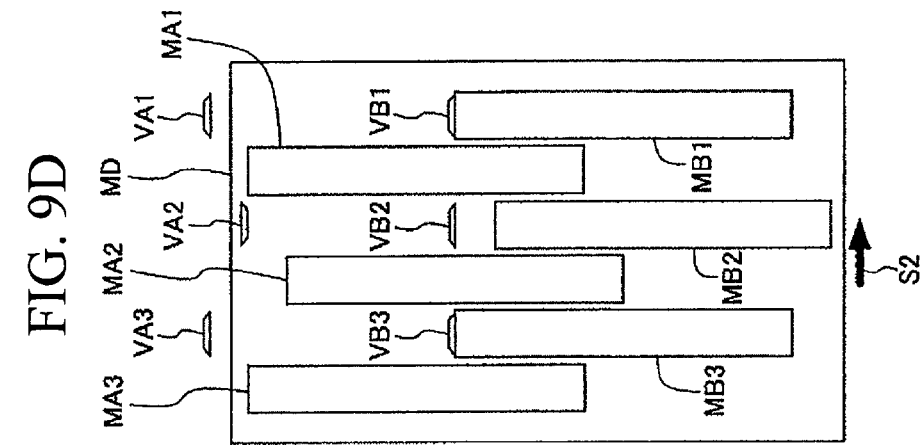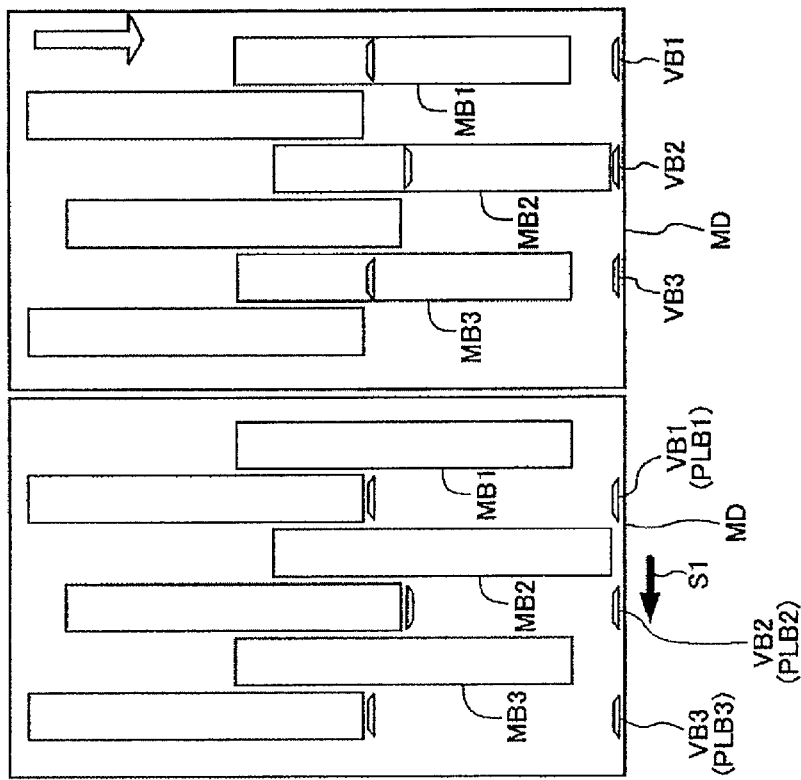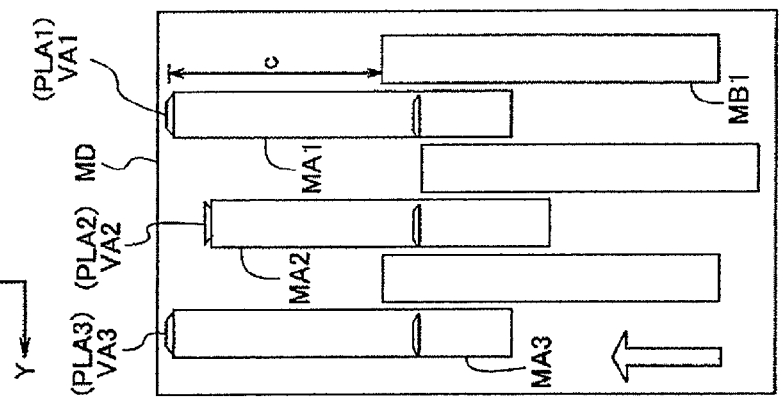

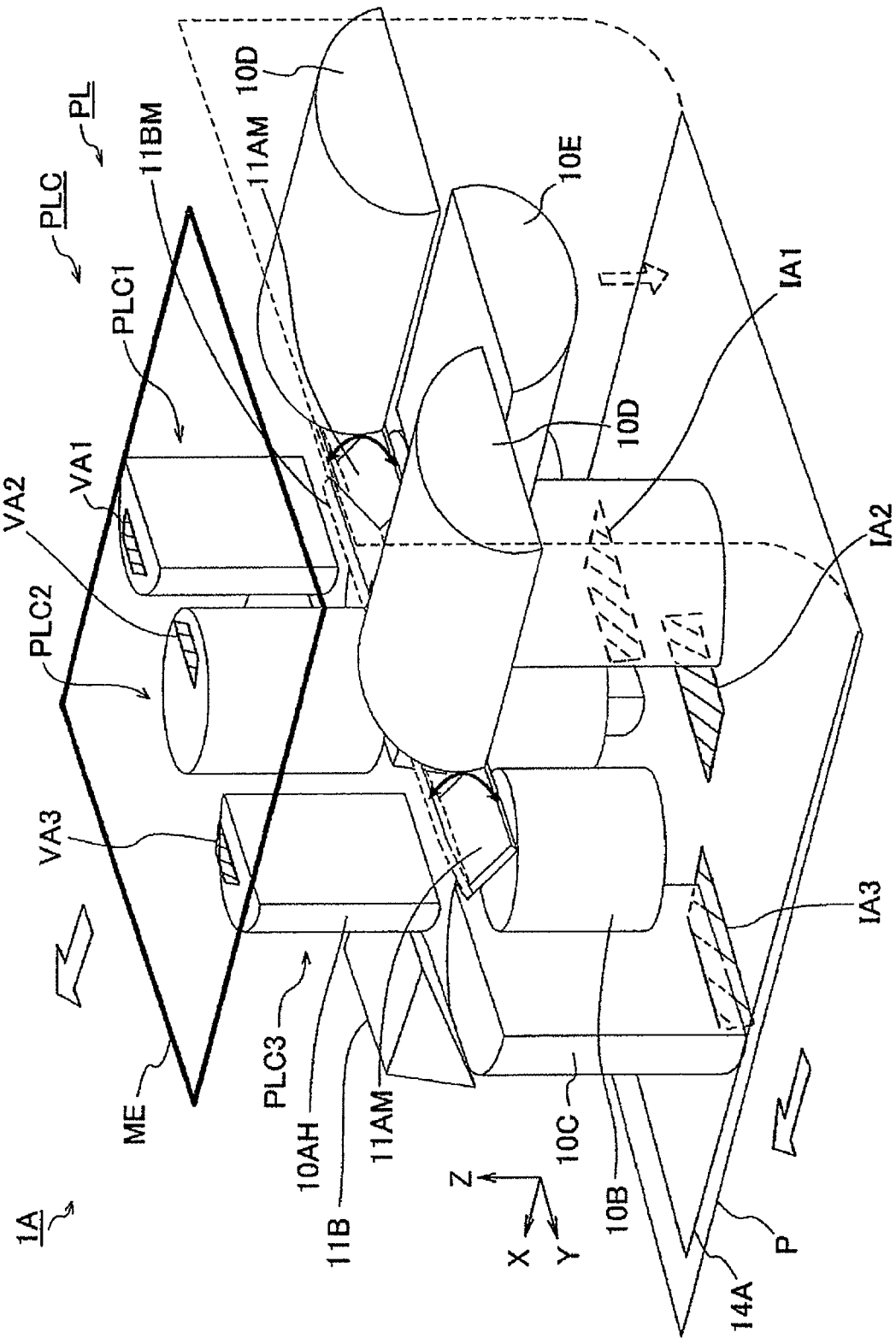

FIG. 14
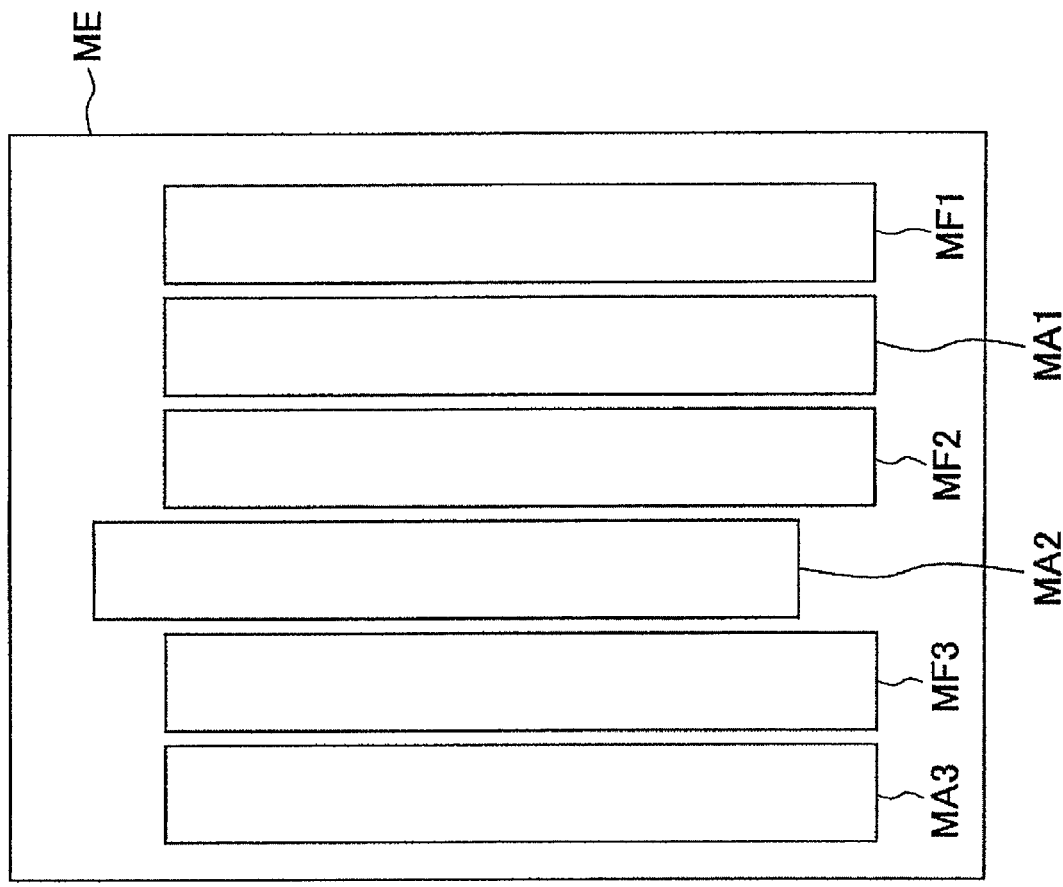
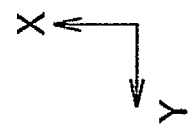

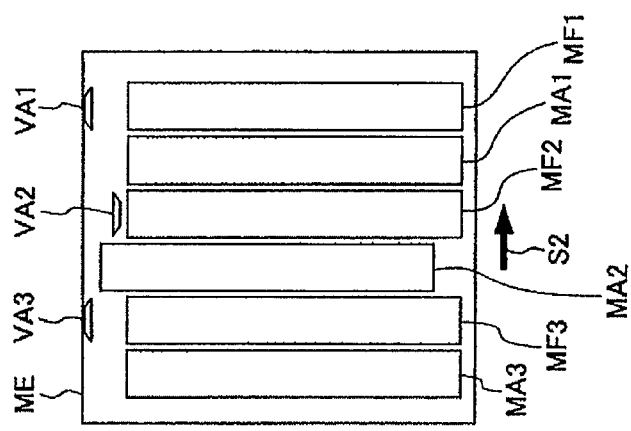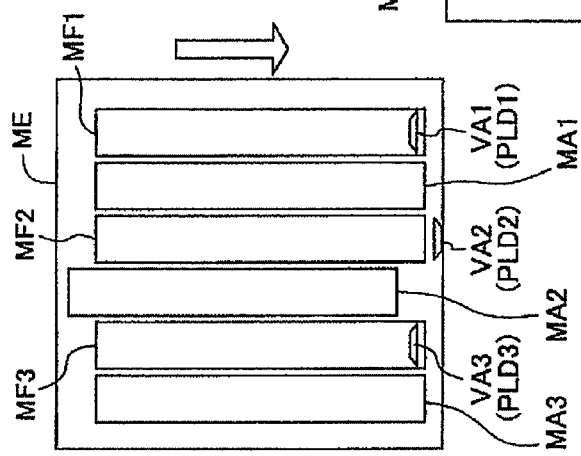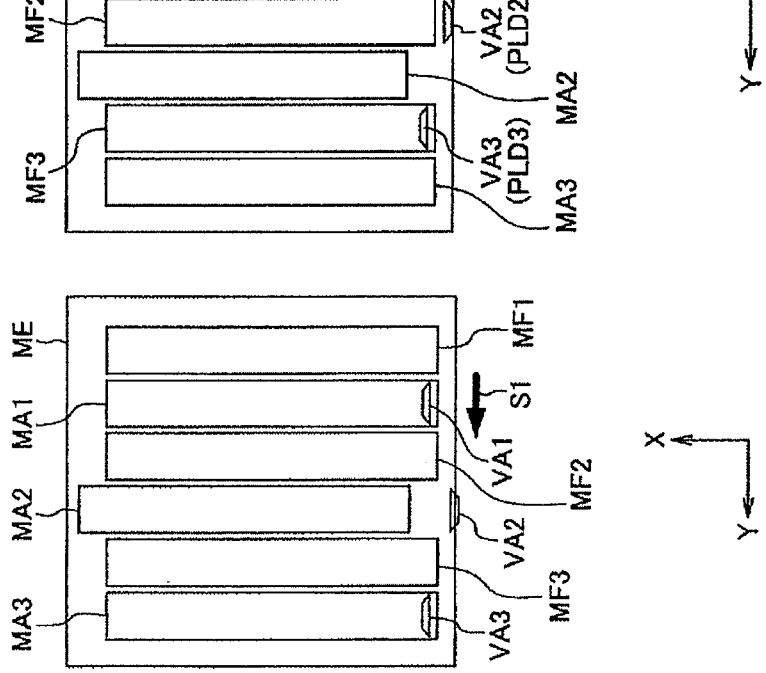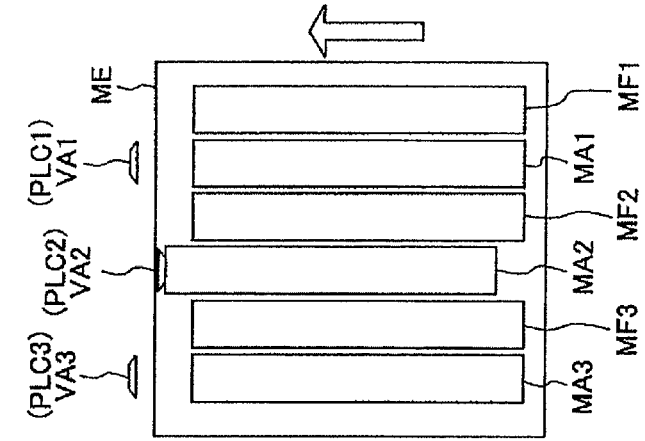

EXPOSURE APPARATUS, EXPOSURE METHOD AND DEVICE FABRICATING METHOD

CROSS-REFERENCE TO RELATED APPLICATION

This application is a non-provisional application claiming priority to and the benefit of U.S. provisional application 61/297,331, filed Jan. 22, 2010, and claims priority to Japanese Patent Application No. 2009-115199, filed on May 12, 2009. The contents of these applications are incorporated herein.

BACKGROUND

1. Field of the Invention

The present invention relates to an exposure technique for exposing a substrate via a mask and a projection optical system, which is suitable for exposing a long sheet-shaped photosensitive object wound in a roll shape. In addition, the present invention relates to a fabricating technique for fabricating (manufacturing) a device using such an exposure technique.

2. Description of Related Art

For example, in an exposure apparatus that is used for fabricating an element such as a semiconductor element or a liquid crystal display element, a typical exposure target (exposure object) has conventionally been a flat plate-shaped object which has high rigidity, such as a glass substrate or a semiconductor wafer which have been coated with photoresist. In recent years, in order to efficiently fabricate a device having a large area, as an exposure target, a long sheet-shaped member which is flexible and can be stored by being wound up into a roll shape has been used. When exposing such a long sheet-shaped member, as a conventional example, a part of the sheet-shaped member is exposed via a mask and a projection optical system is subjected to one-shot exposure (still exposure), the sheet-shaped member is then suctioned and moved, for example, by an exposure table, and then the suction is released and only the exposure table is returned to the initial position. The above described operation is repeatedly carried out to intermittently move the sheet-shaped member from a supply roller to a winding-up roller (for example, see Japanese Patent Application Publication No. 2007-114385).

According to the conventional exposure method of the sheet-shaped member, one-shot exposure via a mask and movement of the sheet-shaped member are alternately repeated. Therefore, exposure efficiency is low, and, for example, it takes a long time to expose a sheet-shaped member which is wound up into one roll.

In contrast, a method is also considered in which the sheet-shaped member is scan-exposed while a mask and the sheet-shaped member are moved synchronously. However, in the case of mere scan exposure, for example, if the sheet-shaped member is exposed in an outward path of the mask, then it is difficult to expose the sheet-shaped member in a return path of the mask. For this reason, substantially half of the reciprocation time of the mask becomes a period at which exposure is impossible, and exposure efficiency cannot be high.

SUMMARY

Aspects of the present invention were conceived in view of the above described circumstances, and have a purpose to provide a device fabricating technique and an exposure technique which can efficiently expose a long sheet-shaped photosensitive object which is flexible.

An exposure method according to a first aspect of the invention is an exposure method for projecting an image of a pattern of a mask onto a substrate and exposing the substrate, the method comprises: reciprocating the mask along a first direction; synchronizing a movement of the mask and a movement of the substrate to a second direction along a surface of the substrate; projecting an image of a first pattern of the mask onto the substrate as an erected image with respect to the second direction, during a first period in which the mask that is reciprocating is moved to one side of the first direction; and projecting an image of a second pattern of the mask onto the substrate as an inverted image with respect to the second direction, during a second period in which the mask that is reciprocating is moved to the other side of the first direction.

An exposure method according to second aspect of the invention is an exposure method for exposing a substrate via a pattern of a mask, the exposure method comprises: exposing a first area of the substrate via a first pattern of the mask and a first projection optical system which projects an erected image with respect to a second direction, while synchronizing a movement of the mask to one side along a first direction and a movement of the substrate to the second direction; and exposing a second area of the substrate via a second pattern of the mask and a second projection optical system which projects an inverted image with respect to the second direction, while synchronizing a movement of the mask to the other side along the first direction and a movement of the substrate to the second direction.

An exposure apparatus according to third aspect of the invention comprises: a mask stage which holds a mask having a pattern and reciprocates in a first direction; a substrate movement mechanism which holds a substrate and moves the substrate to a second direction along a surface of the substrate; a control system which synchronously drives the mask stage and the substrate movement mechanism; a first projection optical system which projects an image of a first pattern of the mask, which is moved to one side of the first direction by the mask stage, onto the substrate as an erected image with respect to the second direction; and a second projection optical system which projects an image of a second pattern of the mask, which is moved to the other side of the first direction by the mask stage, onto the substrate as an inverted image with respect to the second direction.

A method for fabricating a device according to fourth aspect of the invention comprises exposing a photosensitive substrate using an exposure method or exposure apparatus of the invention, and processing the exposed photosensitive substrate.

According to the aspects of the invention, the substrate can be exposed during reciprocation of the mask. Therefore, when the substrate is, for example, a long sheet-shaped photosensitive object which is flexible, exposure can be efficiently performed while moving the substrate in a predetermined direction continuously or intermittently.

BRIEF DESCRIPTION OF THE DRAWINGS

FIGS. 6A, 6B, 6C, and 6D are views showing an example of change in the positional relationship between a mask M during exposure and an illumination area.

FIGS. 8A, 8B, 8C, 8D, and 8E are views showing an example of change in the positional relationship between a mask MC during exposure shown in FIG. 7B and an illumination area.

FIGS. 9A, 9B, 9C, and 9D are views showing an example of change in the positional relationship between a mask MD during exposure shown in FIG. 7C and an illumination area.

FIG. 10 is a perspective view showing a main part of an exposure apparatus of a second embodiment which uses a first projection optical system PLC.

FIG. 14 is a plan view showing a mask which is used in the second embodiment.

FIGS. 15A, 15B, 15C, and 15D are plan views showing an example of change in the relative positions of a mask during exposure and an illumination area in the second embodiment.

DESCRIPTION OF EMBODIMENTS

[First Embodiment]

Hereinafter, a first embodiment of the invention will be described with reference to FIGS. 1 to 6.

Figure 1:
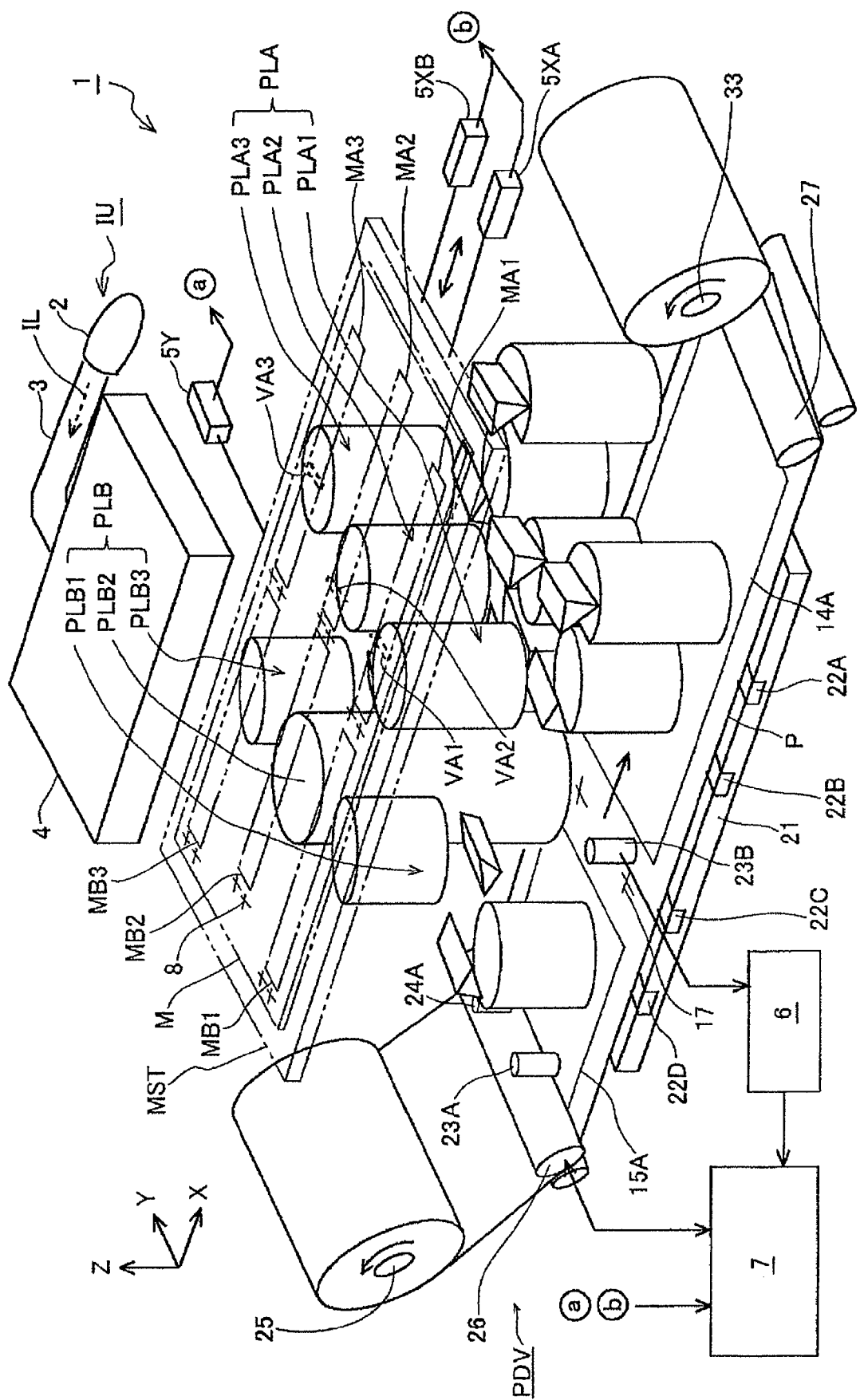
FIG. 1 is a perspective view showing the configuration of an exposure apparatus according to a first embodiment.

FIG. 1 shows the schematic configuration of a scan type exposure apparatus 1 (projection exposure apparatus) of this embodiment. In FIG. 1, the exposure apparatus 1 includes an exposure light source 2, an illumination unit IU which illuminates a part of a pattern of a mask M with illumination light IL (exposure light) from the exposure light source 2, a mask stage MST reciprocating while holding the mask M, and a first projection optical system PLA and a second projection optical system PLB which project an image of a part of the pattern of the mask M onto a plate P, respectively. For convenience of description, in FIG. 1, the mask M and the mask stage MST are shown in two-dot chain lines. The mask M is suctioned and held on a area of the mask stage MST including an opening. The mask stage MST is movably mounted on a mask base (not shown) having an aperture (opening) for the illumination light passing through, between the illumination unit IU and the projection optical systems PLA and PLB.

The exposure apparatus 1 includes a plate moving apparatus PDV which moves the plate P in a predetermined direction continuously or intermittently, a drive mechanism (not shown) which includes a linear motor or the like for driving the mask stage MST, and a main control system 7 which is composed of a computer and performs integrated control of the operations of the exposure apparatus 1. The plate P of this embodiment is, for example, a long sheet-shaped member made of synthetic resin which is flexible and can be stored by being wound up into a roll shape, and is used for fabricating (manufacturing) a display element or the like. Photoresist (photosensitive material) is coated on a surface of the plate P.

The fact that the plate P has a sheet shape means that the plate P has a thickness sufficiently smaller (thinner) than the size (area) of the plate P, and the plate P has flexibility.

In the following description, the positional relationship between members will be described with reference to the XYZ orthogonal coordinate system set in FIG. 1. In this XYZ orthogonal coordinate system, the X axis and the Y axis are set on a horizontal plane, and the Z axis is set in a vertical direction. In this embodiment, the pattern surface of the mask M is parallel to the XY plane, and a portion of the surface of the plate P onto which illumination light IL is irradiated during scan exposure is also parallel to the XY plane. The direction (scan direction) of reciprocation (back and forth movement) of the mask M during scan exposure is a direction (X direction) parallel to the X axis.

The plate P is first moved through the image plane side of the second projection optical system PLB in the +X direction (to the +X direction) and then moved through the image plane side of the first projection optical system PLA in the +X direction (to the +X direction) by the plate moving apparatus PDV. Thus, both the scan directions of portions to be exposed of the plate P which are scan-exposed via the projection optical systems PLA and PLB are the +X direction.

In FIG. 1, the exposure light source 2 includes an ultrahigh pressure mercury lamp, an elliptical mirror, and a wavelength selection element. The illumination unit IU includes a light transmission optical system 3 which includes a light guide or the like, and a splitting optical system 4 which splits incident illumination light IL into six luminous fluxes and emits each of the luminous fluxes via an optical integrator, a relay optical system, a variable blind (variable field diaphragm), and a condenser lens. The illumination light IL emitted from the exposure light source 2 and selected from a wavelength band including a g-rays (wavelength 436 nm), an h-rays (wavelength 405 nm), and an i-rays (wavelength 365 nm). This illumination light IL illuminates six illumination areas (regions) of the pattern surface of the mask M with a uniform illuminance distribution via the light transmission optical system 3 and the splitting optical system 4, in which the six illumination areas are independently opened and closed by the variable blinds, respectively. The illumination areas have an elongated shape in the non-scan direction (Y direction) that is orthogonal (intersects) to the scan direction.

In FIG. 1, three rows of partial pattern areas MA1, MA2, and MA3 are arranged in the +Y direction at a predetermined interval in an area in the +X direction of the pattern area of the mask M. The projection magnification β of the projection optical systems PLA and PLB of this embodiment from the mask M to the plate P is an enlargement magnification (β>1). In this case, a pattern to be transferred onto the plate P is reduced by 1/β and divided in the Y direction, and then partial patterns thereof which are inverted in the Y direction are formed in the partial pattern areas MA1 to MA3 of the mask M. In addition, three rows partial pattern areas MB1, MB2, and MB3 are arranged in the +Y direction at a predetermined interval in an area in the −X direction of the pattern area of the mask M so as to be opposite to the partial pattern areas MA1 to MA3. Partial patterns obtained by inverting the partial patterns formed in the partial pattern areas MA1 to MA3 in the X direction (scan direction) are formed in the partial pattern areas MB1 to MB3 (see FIG. 6A).

For example, two two-dimensional alignment marks 8 are formed in the vicinity of each end portions in the X direction of the partial pattern areas MA1 to MA3 and MB1 to MB3 of the mask M. Information of positional relationship between the alignment marks 8 and the partial pattern areas MA1 to MA3 and MB1 to MB3 is stored in a storage section of the main control system 7.

Figure 4A:
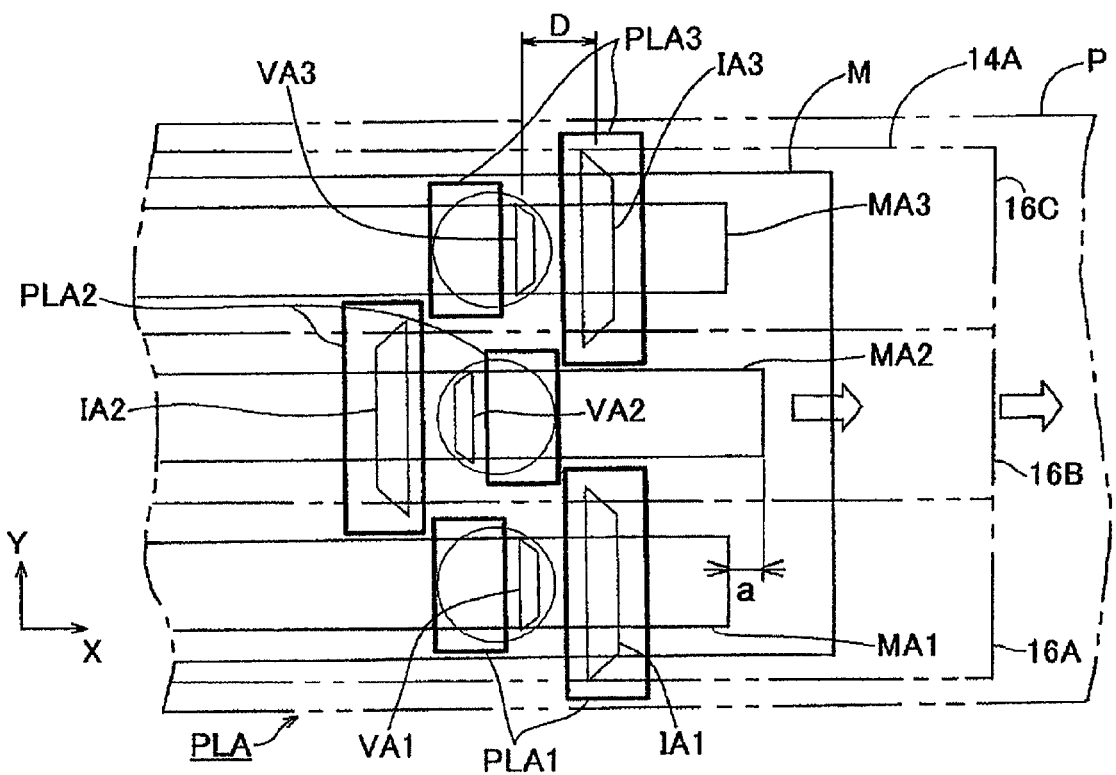
FIG. 4A is a plan view of a mask M, a projection optical system PLA, and a plate P when viewed from an illumination unit IU shown in FIG. 1.
Figure 4B:
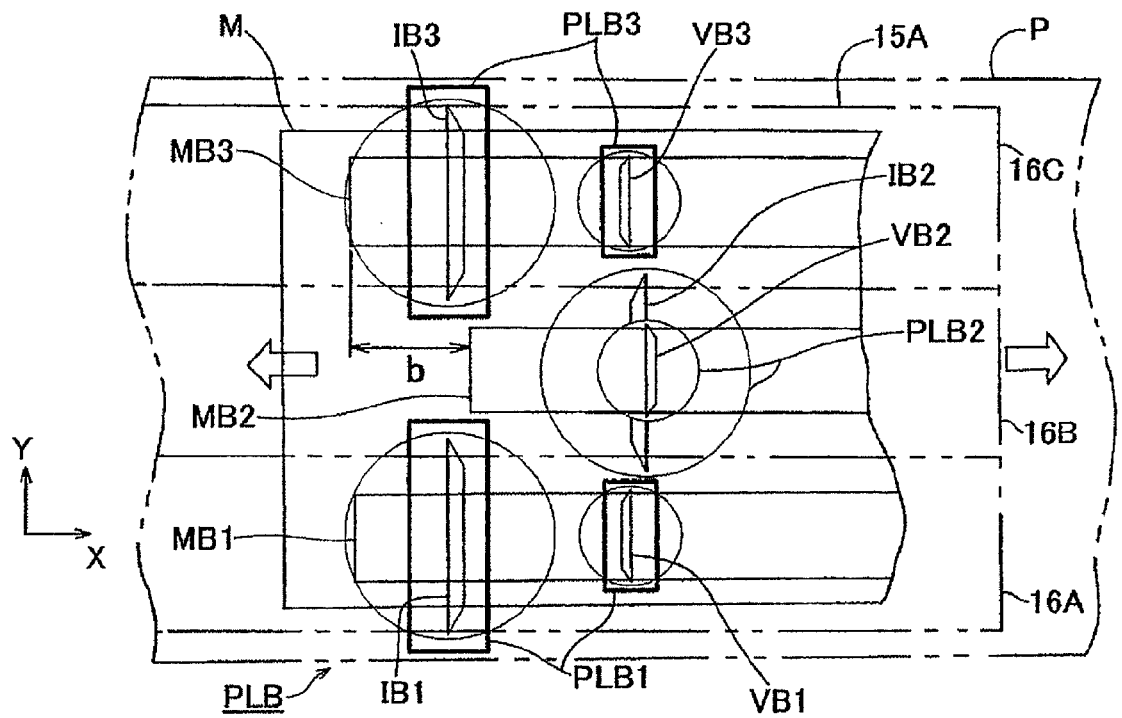
FIG. 4B is a plan view of a mask M, a projection optical system PLB, and a plate P when viewed from the illumination unit IU shown in FIG. 1.

FIG. 4A is a plan view of the mask M, the projection optical system PLA, and the plate P when viewed from the illumination unit IU shown in FIG. 1. FIG. 4B is a plan view of the mask M, the projection optical system PLB, and the plate P when viewed from the illumination unit IU shown in FIG. 1. When the mask M is moved in (along) the +X direction and exposure is performed, the plate P is moved in the +X direction at a β times of speed (β is projection magnification), and as shown in FIGS. 1 and 4A, the partial pattern areas MA1, MA2, and MA3 are illuminated at three illumination areas VA1, VA2, and VA3 which are arranged so as to be deviated from each other (mutually offset) in the X direction. The illumination areas VA1 to VA3 are closed by the variable blinds of the splitting optical system 4 at the areas other than the partial pattern areas MA1 to MA3.

Meanwhile, when the mask M is moved in the −X direction and exposure is performed, the plate P is moved in the +X direction at a β times of speed, and as shown in FIG. 4B, the partial pattern areas MB1, MB2, and MB3 are illuminated at three illumination areas VB1, VB2, VB3 which are substantially arranged in line in the Y direction. The illumination areas VB1 to VB3 are also closed by the variable blinds of the splitting optical system 4 in the areas other than the partial pattern areas MB1 to MB3. The illumination areas VB1 to VB3 are respectively arranged at positions shifted in the −X direction (or +X direction) with respect to the illumination areas VA1 to VA3. In order to reduce stitching error (joining error), double exposure is preferably performed at the boundary portions of the partial pattern areas MA1 to MA3 and MB1 to MB3. For this reason, the illumination areas VA1 to VA3 and VB1 to VB3 are formed in a trapezoidal shape two ends (or one end) thereof in the Y direction are sloped.

In this embodiment, the first projection optical system PLA is arranged so as to be adjacent to the +X direction with respect to the second projection optical system PLB. The first projection optical system PLA includes three partial projection optical systems PLA1, PLA2, and PLA3 which project a part of the pattern of the mask M onto the plate P at the projection magnification β as an erected image in the X direction and an inverted image in the Y direction. The second projection optical system PLB includes three partial projection optical systems PLB1, PLB2, and PLB3 which project a part of the pattern of the mask M onto the plate P at the projection magnification β as an inverted image in the X direction and the Y direction. The images of the patterns in the illumination areas VA1, VA2, and VA3 shown in FIG. 4A are projected onto exposure areas (areas conjugate to the illumination areas) IA1, IA2, and IA3 on the plate P via the three partial projection optical systems PLA1, PLA2, and PLA3 of the first projection optical system PLA. The images of the patterns in the illumination areas VB1, VB2, and VB3 shown in FIG. 4B are projected on exposure areas IB1, IB2, and IB3 on the plate P via the three partial projection optical systems PLB1, PLB2, and PLB3 of the second projection optical system PLB.

Thus, the illumination areas VA1 to VA3 and VB1 to VB3 are set (arranged) within the visual field on the object plane (first plane) side of the partial projection optical systems PLA1 to PLA3 and PLB1 to PLB3, and the exposure areas IA1 to IA3 and IB1 to IB3 are set (arranged) within the visual field on the image plane (second plane) side of the partial projection optical systems PLA1 to PLA3 and PLB1 to PLB3. In this case, the exposure areas IA1 and IA3 are respectively shifted from the illumination areas VA1 and VA3 at a predetermined distance D in the +X direction (scan direction), and the exposure area IA2 is shifted from the illumination area VA2 at the distance D in the −X direction, such that the partial projection optical systems PLA1 to PLA3 can be easily arranged. Similarly, the exposure areas IB1 and IB3 are respectively shifted from the illumination areas VB1 and VB3 at a predetermined distance in the −X direction, and the exposure area IB2 is arranged at the same position as the illumination area VB2 in the X direction and the Y direction, such that the partial projection optical systems PLB1 to PLB3 can be easily arranged.

The partial projection optical systems PLA1 and PLA3 at both ends of the first projection optical system PLA of this embodiment are catadioptric optical systems having the same configuration, and the central partial projection optical system PLA2 has a configuration that the partial projection optical system PLA1 rotates around the axis parallel to the Z axis by 180°. The partial projection optical systems PLB1 and PLB3 on both sides of the second projection optical system PLB are catadioptric optical systems having the same configuration, and the central partial projection optical system PLB2 is, for example, a straight barrel-type refractive system.

Figure 2:
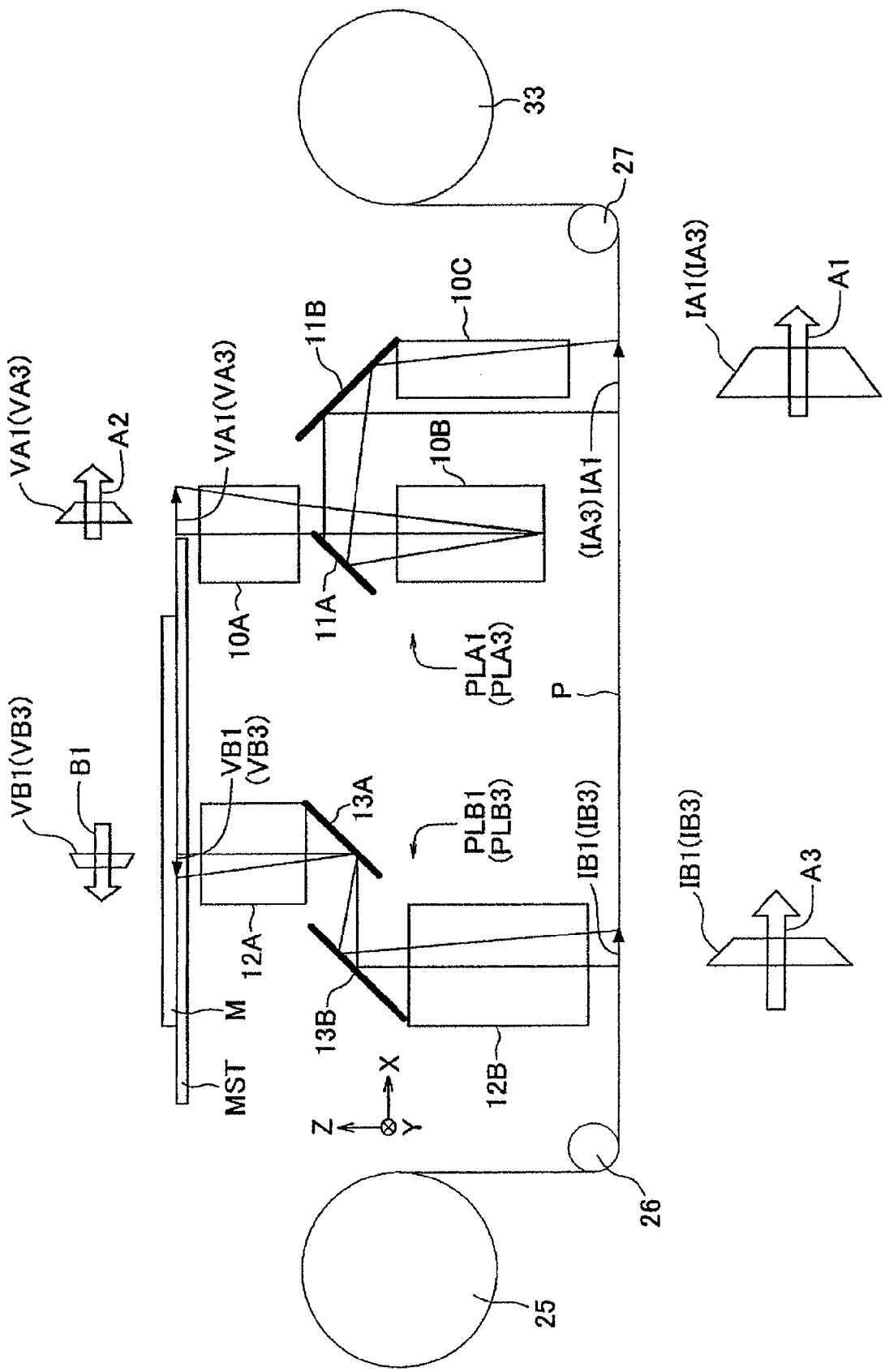
FIG. 2 is a view showing a main part including partial projection optical systems PLA1 and PLB1 of the exposure apparatus shown in FIG. 1.
Figure 3:
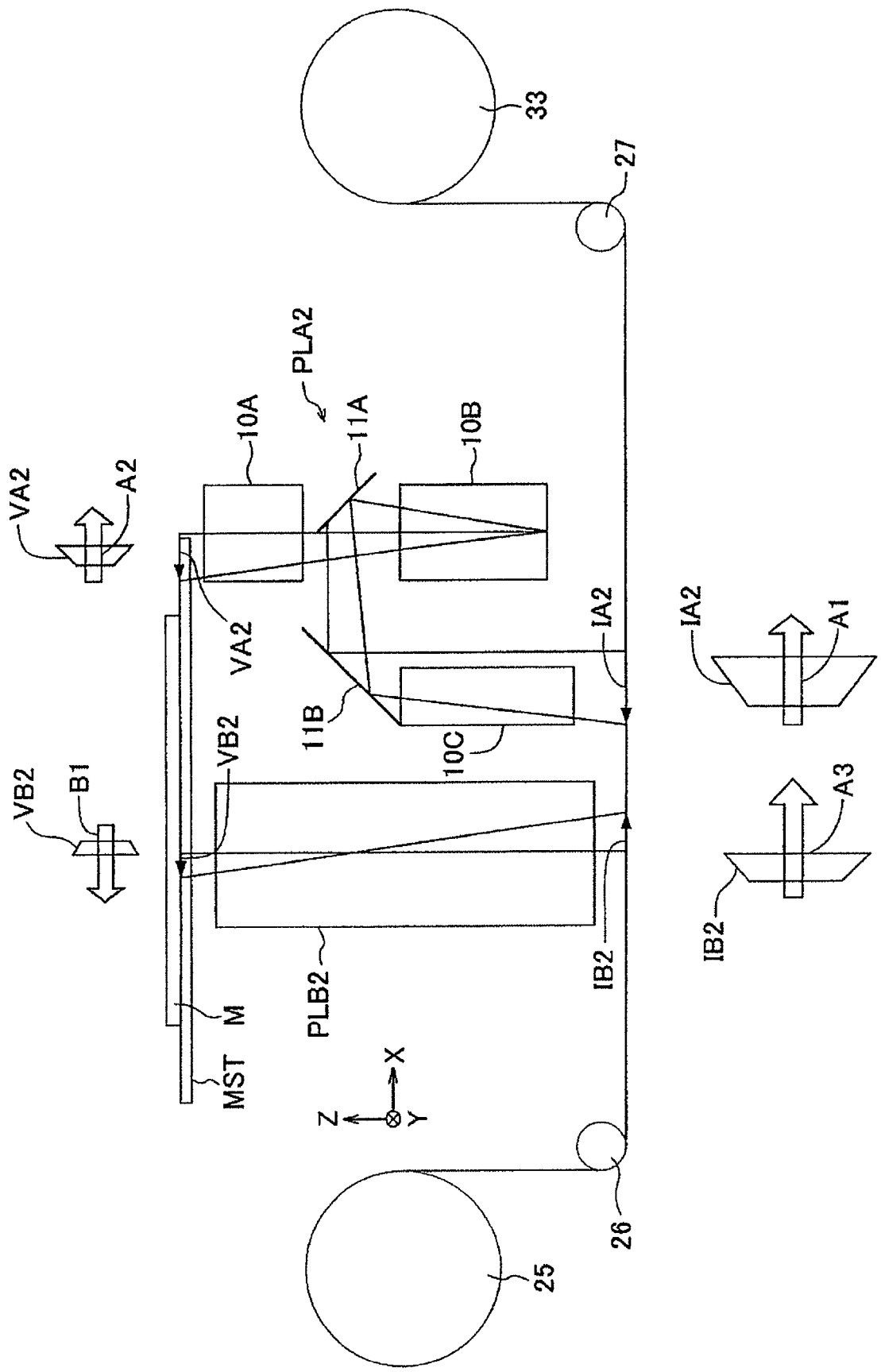
FIG. 3 is a view showing a main part including partial projection optical systems PLA2 and PLB2 of the exposure apparatus shown in FIG. 1.

FIG. 2 is a front view showing a main part including the partial projection optical systems PLA1 and PLB1 of the exposure apparatus 1 shown in FIG. 1. FIG. 3 is a front view showing a main part including the partial projection optical systems PLA2 and PLB2 of the exposure apparatus 1 shown in FIG. 1. In FIG. 2, the projection optical system PLA1 includes a first optical system 10A which receives illumination light from the illumination area VA1 of the mask M, a catadioptric optical system 10B which includes a concave mirror for reflecting illumination light from the first optical system 10A to the +Z direction, a first mirror 11A which bends illumination light from the catadioptric optical system 10B to the +X direction, a second mirror 11B which bends the bent illumination light to the −Z direction, and a second optical system 10C which guides illumination light from the second mirror 11B to the exposure area IA1 on the plate P. The second optical system 10C is an optical system on the half surface side in the +X direction of the axisymmetric optical system. Thus, the partial projection optical system PLA1 can be reduced in size (miniaturization).

The partial projection optical system PLA1 has three reflecting surfaces, and forms an image of the pattern of the illumination area VA1 in the exposure area IA1 to be erected in the X direction and inverted in the Y direction. The configuration of the partial projection optical system PLA3 which forms the image of the pattern of the illumination area VA3 in the exposure area IA3 is the same as that of the partial projection optical system PLA1. At the time of scan exposure, the mask M is scanned in the +X direction as indicated by an arrow A2 with respect to the illumination areas VA1 and VA3, and the plate P is scanned in the +X direction as indicated by an arrow A1 with respect to the exposure areas IA1 and IA3. A magnification adjustment optical system which adjusts the projection magnification, and an image shift optical system which adjusts the position of a projection image in the X direction and the Y direction may be arranged in a mask-side portion of the first optical system 10A or a plate-side portion of the second optical system 10C of the partial projection optical system PLA1. The same can be applied to the partial projection optical systems PLA2, PLA3, and PLB1 to PLB3.

The projection optical system PLB1 includes a first optical system 12A which receives illumination light from the illumination area VB1 of the mask M, a first mirror 13A which bends illumination light from the first optical system 12A to the −X direction, a second mirror 13B which bends the bent illumination light to the −Z direction, and a second optical system 12B which guides illumination light from the second mirror 13B to the exposure area IB1 on the plate P. The partial projection optical system PLB1 has two reflecting surfaces, and forms an image of the pattern of the illumination area VB1 in the exposure area IB1 to be inverted in the X direction and the Y direction. The configuration of the partial projection optical system PLB3 which forms the image of the pattern of the illumination area VB3 in the exposure area IB3 is the same as that of the partial projection optical system PLB1. At the time of scan exposure, the mask M is scanned in the −X direction as indicated by an arrow B1 with respect to the illumination areas VB1 and VB3, and the plate P is scanned in the +X direction as indicated by an arrow A3 with respect to the exposure areas IB1 and IB3.

In FIG. 3, the partial projection optical system PLA2 has a configuration that the partial projection optical system PLA1 shown in FIG. 2 rotates by 180°, and the partial projection optical system PLA2 forms an image of the pattern of the illumination area VA2 in the exposure area IA2 to be erected in the X direction and inverted in the Y direction. At the time of scan exposure, the mask M is scanned in the +X direction as indicated by an arrow A2 with respect to the illumination area VA2, and the plate P is scanned in the +X direction as indicated by an arrow A1 with respect to the exposure area IA2. Meanwhile, the projection optical system PLB2 is a refractive system, and forms an image of the pattern of the illumination area VB2 in the exposure area IB2 to be inverted in the X direction and the Y direction. At the time of scan exposure, the mask M is scanned in the −X direction as indicated by an arrow B1 with respect to the illumination area VB2, and the plate P is scanned in the +X direction as indicated by an arrow A3 with respect to the exposure area IB2.

As shown in FIG. 4A, the exposure areas IA1 to IA3 of the partial projection optical systems PLA1 to PLA3 enable to perform exposure while stitching (patching) partial areas 16A to 16C in a pattern formation area 14A of the plate P, which moves in the +X direction, in the Y direction. In addition, as shown in FIG. 4B, the exposure areas IB1 to IB3 of the partial projection optical systems PLB1 to PLB3 enable to perform exposure while stitching (patching) partial areas 16A to 16C in a pattern formation area 15A of the plate P, which moves in the +X direction, in the Y direction. As a result, images which are obtained by stitching the enlarged images of the patterns of the partial pattern areas of the mask M can be exposed in the pattern formation areas 14A and 15A, respectively.

In this case, the illumination areas VA1 to VA3 and the exposure areas IA1 to IA3 are deviated (offset) from each other in the X direction, and the plate P moves at a β (β is projection magnification) times of the scan speed of the mask M. For this reason, in order to stitch and expose the images of the partial pattern areas MA1 to MA3 of the mask M in the partial areas 16A to 16C arranged within the pattern formation area 14A of the plate P in the Y direction, the partial pattern area MA2 is shifted with respect to the partial pattern areas MA1 and MA3 at a distance a in the X direction. Similarly, since the illumination areas VB1 to VB3 and the exposure areas IB1 to IB3 are deviated from each other in the X direction, in order to stitch and expose the images of the partial pattern areas MB1 to MB3 of the mask M in the partial areas 16A to 16C within the pattern formation area 15A of the plate P, the partial pattern area MB2 is shifted with respect to the partial pattern areas MB1 and MB3 at a distance b in the X direction.

If the areas on the plate P which are sequentially exposed by the projection optical system PLA (partial projection optical systems PLA1 to PLA3) are described as pattern formation areas (first pattern formation area) 14A, 14B (not shown), . . . , and the areas on the plate p which are sequentially exposed by the projection optical system PLB (partial projection optical systems PLB1 to PLB3) are described as pattern formation areas (second pattern formation areas) 15A, 15B (not shown), . . . , the pattern formation areas 14A, 14B, . . . , and the pattern formation areas 15A, 15B, . . . are arranged on the plate P alternately in a longitudinal direction.

Next, in FIG. 1, positional information of the mask stage MST holding the mask M is measured by two-axis interferometers 5XA and 5XB on the X axis and an interferometer 5Y on the Y axis, and the measured value is sent to the main control system 7. The main control system 7 calculates the position of the mask stage MST in the X direction and the Y direction and the rotation angle θz around the Z axis from (based on) the measured value, and maintains the rotation angle θz of the mask stage MST at a predetermined value based on the positional information via a drive mechanism (not shown), such as a linear motor, thereby controlling the speed and the position in the X direction and the Y direction.

The plate moving apparatus PDV includes a supply roller 25 which winds off the sheet-shaped plate P, two double rollers 26 and 27 which move the plate P in the +X direction at a predetermined speed, and a wind-up roller 33 which winds up the plate P. The plate moving apparatus PDV includes a drive section (not shown) which drives the double rollers 26 and 27 and measures the movement speed of the plate P between the double rollers 26 and 27, and an exposure stage 21 on which the plate P which moves through the image planes of the projection optical systems PLA and PLB is mounted.

The exposure stage 21 is mounted on the upper surface of a base member (not shown) parallel to the XY plane, and is usually stationary on the base member. If necessary, the exposure state 21 can move in the X direction with a predetermined range. Positional information of the exposure stage 21 in the X direction is measured by, for example, a laser interferometer (not shown), and the measured information is sent to the main control system 7. A plurality of air pads (air bearings) are provided on the upper surface of the exposure stage 21 so as to suction the plate P by such an suction force that there is no influence on movement of the plate P in the X direction.

A rough movement speed of the plate P from the supply roller 25 to the wind-up roller 33 is defined by a winding speed of the wind-up roller 33, and an accurate movement speed of the plate P is defined by, for example, the double roller 27. A drive section (not shown) includes a rotary motor which drives the double roller 27, and a detection section which detects the movement speed of the plate P in the +X direction from the rotation speed of the double roller 27. The main control system 7 drives the rotary motor based on this detection result such that the movement speed of the plate P in the +X direction becomes a target value.

Spatial image measurement systems 22A, 22B, 22C, and 22D are provided on the exposure stage 21 so as to measure the positions of the images of the alignment marks 8 of the mask M formed by the partial projection optical systems PLA1, PLA3 and PLA2 and the partial projection optical systems PLB2 and PLB1, and PLB3. The measurement results of the spatial image measurement systems 22A to 22D are sent to an alignment processing system 6. The alignment processing system 6 calculates the position of the mask M in the X direction and the Y direction and the rotation angle θz (alignment information) from positional information of the images of the alignment marks 8, and sent the alignment information to the main control system 7.

A first set of image processing alignment sensors 23B and 24B (24B is not shown) are provided upper side of the plate P on the front side (−X direction) of the first projection optical system PLA, and a second set of image processing alignment sensors 23A and 24A are provided upper side of the plate P on the front side (−X direction) of the second projection optical system PLB. Hereinafter, two sets of alignment sensors 23A and 24A, and 23B and 24B are referred to as alignment sensors 23A, 23B and the like.

A pair of alignment marks 17, for example, are formed at different positions in the Y direction in the areas in the +X direction (forward) of the pattern formation area 14A by the first projection optical system PLA and the pattern formation area 15A by the second projection optical system PLB on the plate P. Information of positional relationship between the pattern formation areas 14A, 15A (and the like) and the corresponding alignment marks 17 is stored in a storage unit of the main control system 7.

The alignment sensors 23A, 23B and the like irradiate illumination light in a wavelength band which does not sensitize photoresist on the plate P, and detect the alignment marks 17 in front of the pattern formation areas 14A and 15A, and send the detection results to the alignment processing system 6. The exposure stage 21 is moved in the X direction in advance, for example, and a reference mark (not shown) of the spatial image measurements system 22A and the like is detected by the alignment sensors 23A and 23B and the like, such that the distance (base line) in the X direction between the detection center of the alignment sensors 23A and 23B (and the like) and the reference position of the image of the pattern of the mask M, and this base line is stored in the alignment processing system 6. The alignment processing system 6 send positional information obtained by correcting the detection results of the alignment sensors 23A, 23B and the like based on the base line to the main control system 7.

The main control system 7 can overlay the image of the pattern of the mask M on the pattern formation areas 14A, 15A and the like of the plate P from the measurement results of the spatial image measurement systems 22A to 22D and the detection results of the alignment sensors 23A, 23B, and the like.

Figure 5:
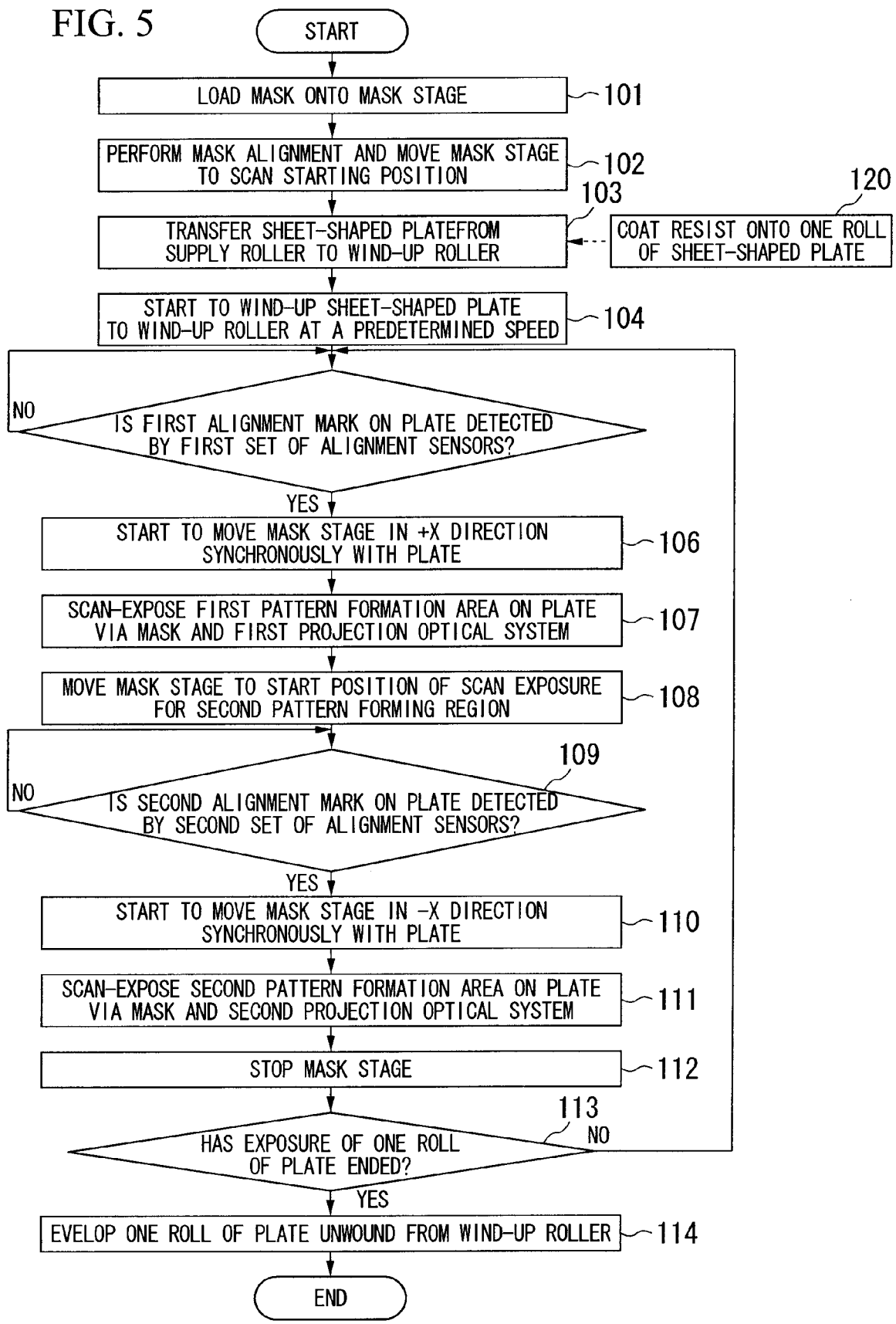
FIG. 5 is a flowchart showing an example of an exposure operation of the first embodiment.

Hereinafter, an example of an exposure operation of the exposure apparatus 1 of this embodiment will be described with reference to a flowchart of FIG. 5. This exposure operation is controlled by the main control system 7.

First, the mask M is loaded onto the mask stage MST shown in FIG. 1 (Step 101). Next, the images of the alignment marks 8 of the mask M formed by the projection optical systems PLA and PLB are sequentially detected via the spatial image measurement systems 22A to 22D, and correction of the rotation angle of the mask stage MST (consequently, the mask M) and measurement (mask alignment) of the position in the X direction and the Y direction of the mask stage MST are carried out. Thereafter, the mask stage MST is moved to a scan starting position in the −X direction (Step 102).

In Step 120, a resist coater (not shown) coats photoresist (resist) onto one roll of sheet-shaped plate P, substantially in parallel to the above-described operation. It is assumed that the alignment marks 17 are formed in front of the pattern formation areas 14A, 15A and the like on the plate P in the previous steps.

Next, one roll of sheet-shaped plate P with photoresist (coated) applied thereto is attached to the supply roller 25 shown in FIG. 1, and the front end portion of the plate P is transferred (spanned) to the wind-up roller 33 via the double rollers 26 and 27 (Step 103). Then, the wind-up roller 33 and the double rollers 26 and 27 are driven by the plate moving apparatus PDV, and starting to wind-up the plate P from the supply roller 25 to the wind-up roller 33 in the +X direction at a predetermined speed (Step 104).

Next, the alignment processing system 6 determines whether or not a pair of alignment marks 17 (first alignment marks) on the plate P are detected at the first set of alignment sensors 23B and the like (Step 105), and when the alignment marks 17 are detected, notify the indication to the main control system 7. Thus, the main control system 7 starts movement of the mask stage MST in the +X direction synchronously with movement of the plate P so as to maintain the positional relationship such that the pattern formation area (this is represented by 14A) on the plate P immediately after the detected alignment marks and the images of the patterns of the partial pattern areas MA1 to MA3 of the mask M overlay (overlap) with each other (Step 106). The movement speed (scan speed) of the plate P in the +X direction on the image plane of the first projection optical system PLA becomes β (β is projection magnification) times of the movement speed of the mask M in the +X direction.

Immediately after the mask stage MST starts to move, the mask M and the plate P are not completely synchronous, but if a short time has elapsed after the start of movement of the mask stage MST, the mask M and the plate P are completely synchronously moved. Thus, immediately after the start of movement, the mask stage MST may be moved at a speed higher than a predetermined movement speed at the time of scan exposure. Thereafter, a predetermined variable blind in the splitting optical system 4 is gradually opened, and the partial pattern areas MA2, MA1, and MA3 of the mask M are sequentially illuminated with the illumination areas VA2, VA1, and VA3 of FIG. 4A. Then, the pattern formation area 14A (first pattern formation area) on the plate P is scan-exposed with the images of the pattern of the partial pattern areas MA1 to MA3 of the mask M formed by the projection optical system PLA (Step 107).

FIGS. 6A to 6D show changes in the positional relationship between the mask M during scan-exposing and the illumination areas VA1 to VA3 and VB1 to VB3 of the partial projection optical systems PLA1 to PLA3 and PLB1 to PLB3 (for convenience of description, the amount of deviation (offset) of the partial pattern areas MA2 and MB2 of the mask M in the X direction differs from that shown in FIG. 1). In this case, as shown in FIG. 6B, the partial pattern areas MA1 to MA3 of the mask M are scanned in the +X direction with respect to the illumination areas VA1 to VA3, and the plate P (pattern formation area 14A) is exposed via the partial projection optical systems PLAT to PLA3 by the patterns in the partial pattern areas MA1 to MA3. Thereafter, when the exposure of the partial pattern areas MA1 to MA3 of the mask M ends, all the variable blinds in the splitting optical system 4 are closed, and scan exposure of the pattern formation area 14A of the plate P ends. An image obtained by stitching the patterns of the partial pattern areas MA1 to MA3 at a magnification of β times is exposed in the pattern formation area 14A. Thereafter, the mask stage MST is moved to the starting position of next scan exposure (Step 108).

Next, the alignment processing system 6 determines whether or not the next pair of alignment marks 17 (second alignment marks) on the plate P is detected by the second set of alignment sensors 23A and 24A (Step 109), and when the alignment marks 17 are detected, notify the indication to the main control system 7. The detection operation of the alignment marks in Step 109 may be performed in parallel to the operation of Steps 107 and 108.

Then, the main control system 7 starts to move the mask stage MST in the −X direction synchronously with movement of the plate P so as to maintain the positional relationship such that the pattern formation area (this is represented by 15A) on the plate P immediately after the detected alignment marks 17 and the images of the patterns of the partial pattern areas MB1 to MB3 of the mask M overlay (overlap) with each other (Step 110). The movement speed of the plate P in the +X direction on the image plane side of the second projection optical system PLB is β times of the movement speed of the mask M in the −X direction. In this case, immediately after the start of movement of the mask stage MST, the mask M and the plate P are not completely synchronous, but if a short time has elapsed after the start of movement of the mask stage MST, the mask M and the plate P are completely synchronously moved.

Thereafter, a predetermined variable blind in the splitting optical system 4 is gradually opened, and the partial pattern areas MB1, MB3, and MB2 of the mask M are sequentially illuminated with the illumination areas VB1, VB3, and VB2 shown in FIG. 4B. Then, the pattern formation area 15A (second pattern formation area) on the plate P is scan-exposed with the images of the patterns of the partial pattern areas MB1 to MB3 formed by the projection optical system PLB (Step 111). In this case, as shown in FIGS. 6D, 6A, and FIG. 6B, the partial pattern areas MB1 to MB3 of the mask M are scanned in the −X direction with respect to the illumination areas VB1 to VB3, and the plate P (pattern formation area 15A) is exposed via the partial projection optical systems PLB1 to PLB3 by the patterns of the partial pattern areas MB1 to MB3.

Thereafter, when the exposure of the partial pattern areas MB1 to MB3 of the mask M via the partial projection optical systems PLB1 to PLB3 ends, all the variable blinds in the splitting optical system 4 are closed, and scan exposure of the pattern formation area 15A of the plate P ends. An image obtained by inverting the patterns of the partial pattern areas MB1 to MB3 in the scan direction and stitching the inverted patterns at a β magnification is exposed in the pattern formation area 15A. At this time, the patterns of the partial pattern areas MB1 to MB3 are obtained by inverting the patterns of the partial pattern areas MA1 to MA3 in the scan direction, so the same pattern as the pattern exposed in the pattern formation area 14A is exposed in the pattern formation area 15A of the plate P. Thereafter, the mask stage MST is moved to the starting position of next scan exposure and stops (Step 112).

Next, it is determined whether or not one roll of plate P has been entirely exposed (Step 113). For example, when a mark representing the end of the plate P is detected at the alignment sensors 23A and 24A, exposure ends. When exposure does not end, the operation returns to Step 105, and when the next alignment marks 17 on the plate P are detected by the alignment sensors 23B and the like, in Steps 106 to 108, the mask M is moved in the +X direction, and the next pattern formation area 14B (not shown) on the plate P is subjected to scan exposure via the first projection optical system PLA. Thereafter, when the next alignment marks 17 on the plate P are detected at the alignment sensors 23A and 24A (Step 109), in Steps 110 to 112, the mask M is moved in the −X direction, and the next pattern formation area 15B (not shown) on the plate P is subjected to scan exposure via the second projection optical system PLB.

Subsequently, while the mask M is reciprocating in the X direction, adjacent pattern formation areas on the plate P are alternately subjected to scan exposure via the projection optical systems PLA and PLB. Thus, the same pattern, that is, the image obtained by enlarging and stitching the patterns of the partial pattern areas MA1 to MA3 (or MB1 to MB3) of the mask M is exposed in a sequence of plural pattern formation areas on the plate P. Then, when exposure ends in Step 113, one roll of exposed plate P is unwound from the wind-up roller 33, and the unwound plate P is developed by a developer (not shown). When there is one roll of plate as the next exposure target, the operation in Steps 103 to 114 is repeated.

The advantages of this embodiment are as follows.

(1) The exposure apparatus 1 of this embodiment includes the mask stage MST which holds the mask M and reciprocates in the X direction (first direction), the plate moving apparatus PDV which holds the plate P and moves the plate P to the +X direction (second direction) along the surface of the plate P, the main control system 7 which synchronously drives the mask stage MST and the plate moving apparatus PDV, the first projection optical system PLA which projects the images of the patterns (first patterns) in the partial pattern areas MA1 to MA3 of the mask M, which is moved in the +X direction as one side of the X direction by the mask stage MST, onto the plate P as an erected image with respect to the +X direction, and the second projection optical system PLB which projects the images of the patterns (second patterns) in the partial pattern areas MB1 to MB3 of the mask M, which is moved in the −X direction as the other side of the X direction by the mask stage MST, onto the plate P as an inverted image with respect to the +X direction.

In this case, the +X direction in which the plate P moves is the direction (optically conjugate direction) which corresponds to the X direction (the X direction on the pattern of the mask M), in which the mask M moves, via the projection optical system PLA.

The exposure method of the exposure apparatus 1, which is controlled by the main control system 7, is an exposure method for projecting the image of the pattern of the mask M onto the plate P and exposing the plate P, in which the exposure method includes Steps 106 to 108 and 110 to 112 for reciprocating the mask M in the X direction, Steps 107 and 111 for synchronously carrying out movement of the mask M and movement of the plate P in the +X direction, Step 107 for projecting the image of the first pattern of the mask M onto the plate P as an erected image with respect to the +X direction during a first period in which the mask M in reciprocation is moved in the +X direction, and Step 111 for projecting the image of the second pattern of the mask M onto the plate P as an inverted image with respect to the +X direction during a second period in which the mask M in reciprocation is moved in the −X direction.

The exposure method of the exposure apparatus 1, which is controlled by the main control system 7, includes Step S107 for synchronously carrying out movement of the mask M in the +X direction and movement of the plate P in the +X direction, and exposing the pattern formation area 14A on the plate P, while exposing the plate P via a part of the pattern of the mask M and the first projection optical system PLA projecting an erected image in the X direction, and Step 111 for synchronously carrying out movement of the mask M in the −X direction and movement of the plate P in the +X direction, and exposing the pattern formation area 15A on the plate P, while exposing the plate P via a part of the pattern of the mask M and the second projection optical system PLB projecting an inverted image in the X direction.

According to this embodiment, while the mask M is reciprocating, the plate P can be exposed alternately via the two projection optical systems PLA and PLB, so even when the plate P is a long sheet-shaped photosensitive object which is flexible, exposure can be efficiently performed for a sequence of pattern formation areas 14A, 15A and the like on the plate P while moving the plate P in a predetermined direction continuously.

The plate P may be stopped when the mask stage MST has been stopped and moved intermittently according to the mask stage MST. During a period in which scan exposure is not performed on the pattern formation areas 14A, 15A and the like of the plate P, the movement speed of the plate P may be slow.

(2) The plate P can be exposed when the mask M is being moved in the +X direction (outward path) and moved in the −X direction (return path) during reciprocation of the mask M, so the plate P can be efficiently exposed. In addition, the first projection optical system PLA projects an erected image in the X direction, and the second projection optical system PLB projects an inverted image in the X direction, so the plate P can be efficiently exposed during the reciprocation of the mask M by using the first projection optical system PLA when the mask M is moved in the +X direction and the second projection optical system PLB when the mask M is moved in the −X direction.

(3) The optical path (the optical path of the first projection optical system PLA) in which the plate P is exposed in Step 107 and the optical path (the optical path of the second projection optical system PLB) in which the plate P is exposed in Step 111 are different.

The projection optical system PLA projects the images of the patterns in the illumination areas VA1 to VA3 of the mask M onto the plate P, and the projection optical system PLB projects the images of the patterns in the illumination areas VB1 to VB3 of the mask M different from the illumination areas VA1 to VA3 onto the plate P. Then, in Step 107, the illumination areas VA1 to VA3 are opened and closed by a predetermined variable blind in the splitting optical system 4, and in Step 111, the illumination areas VB1 to VB3 are opened and closed by the variable blind. Therefore, the plate P can be exposed alternately by the projection optical systems PLA and PLB.

Variable field diaphragms (not shown) may be provided on the surfaces in the vicinity of the illumination areas VA1 to VA3 and VB1 to VB3 (mask surface) in the projection optical systems PLA and PLB, or the conjugate surfaces, and the illumination areas VA1 to VA3 and VB1 to VB3, or the conjugate areas conjugated to those may be substantially opened and closed by the variable field diaphragms.

(4) In this case, the projection optical systems PLA and PLB project the images of the patterns in the different partial pattern areas MA1 to MA3 and MB1 to MB3 on the mask M onto the plate P, and the patterns in the partial pattern areas MA1 to MA3 and MB1 to MB3 are mutually inverted in the X direction. Therefore, the plate P can be exposed alternately via the projection optical systems PLA and PLB during the reciprocation of the mask M, such that the same pattern can be exposed in adjacent pattern formation areas 14A, 15A and the like on the plate P.

The patterns in the partial pattern areas MA1 to MA3 and the patterns in the partial pattern areas MB1 to MB3 may be patterns for different devices which are unrelated to each other. In this case, patterns for different devices are exposed in adjacent pattern formation areas 14A, 15A and the like on the plate P. The patterns in the partial pattern areas MA1 to MA3 and the patterns in the partial pattern areas MB1 to MB3 may be other adjacent patterns within the same layer of the same device. In this case, the patterns in the partial pattern areas MA1 to MA3 and the patterns in the partial pattern areas MB1 to MB3 may be double-exposed in the common pattern formation area of the plate P.

(5) The projection optical systems PLA and PLB respectively include three partial projection optical systems PLA1 to PLA3 and PLB1 to PLB3 which project the images of the patterns in three illumination areas VA1 to VA3 and VB1 to VB3, which are arranged in the direction intersecting the X direction (scan direction) of the mask M, onto the plate P. Therefore, even when the plate P has a large width, the projection optical systems PLA and PLB can be reduced in size as a whole.

The number of partial projection optical systems PLA1 to PLA3 (PLB1 to PLB3) is arbitrary. The projection optical systems PLA and PLB each may be a single projection optical system which projects an image of the pattern in one illumination area onto one exposure area.

(6) The projection magnification β of the projection optical systems PLA and PLB is an enlargement magnification, so the mask M can be reduced in size.

The projection magnification β of the projection optical systems PLA and PLB may be 1× magnification. In this case, the partial pattern areas MA1 to MA3 and MB1 to MB3 of the mask M become one first pattern area and one second pattern area as a whole. For example, if the three partial projection optical systems PLA1 to PLA3 of the projection optical system PLA have the same configuration, and the amount of deviation of the exposure areas IA1 to IA3 in the X direction with respect to corresponding illumination areas VA1 to VA3 is identical, the images of the patterns of the mask M at 1× magnification can be accurately stitched with each other in the Y direction and exposed onto the plate P. Similarly, with regard to the projection optical system PLB, the three partial projection optical systems PLB1 to PLB3 may have the same configuration, and the amount of deviation of the exposure areas IB1 to IB3 in the X direction with respect to corresponding illumination areas VB1 to VB3 may be identical.

The projection magnification β of the projection optical systems PLA and PLB may be a reduction magnification.

(7) The plate P is a sheet-shaped member which is flexible, and the plate P is wound from the supply roller 25 to the wind-up roller 33 by the plate moving apparatus PDV. Therefore, exposure can be performed for a sequence of pattern formation areas on the plate P while easily moving the long sheet-shaped plate P in the X direction continuously or intermittently with a simple mechanism.

Figure 7C:
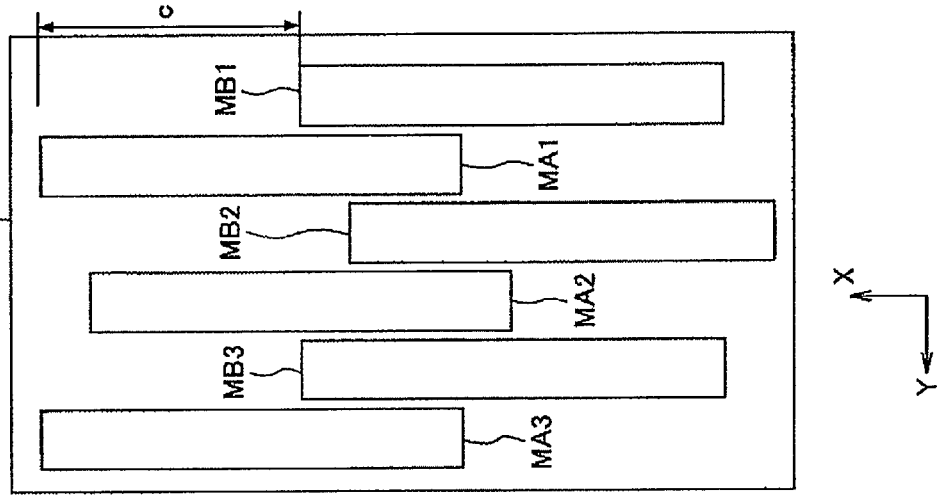
FIG. 7C is a plan view showing yet another mask.
Figure 7B:
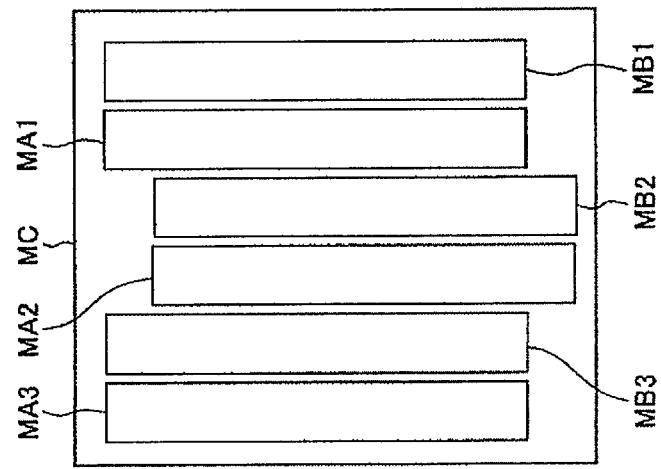
FIG. 7B is a plan view showing another mask.
Figure 7A:
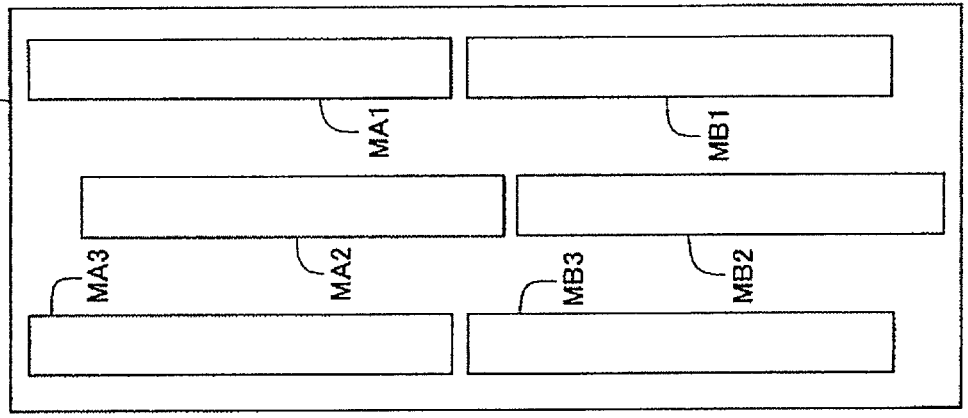
FIG. 7A is a plan view showing a mask shown in FIG. 1.

In the foregoing embodiment, the projection magnification β of the projection optical systems PLA and PLB may be in a range of 1× to 2× magnification, so as shown in FIG. 7A, the partial pattern areas MA1 to MA3 and the partial pattern areas MB1 to MB3 on the mask M are arranged separately in the X direction. However, when the projection magnification β of the projection optical systems PLA and PLB is greater then or equal to 2× magnification (at least 2× magnification), the interval (spacing) between the partial pattern areas MA1 to MA3 in the Y direction is greater then or equal to the width of the partial pattern areas MA1 to MA3. Therefore, as shown in FIG. 7B or 7C, the partial pattern areas MA1 to MA3 (first pattern) for the first projection optical system PLA and the partial pattern areas MB1 to MB3 (second pattern) for the second projection optical system PLB can be arranged on the mask MC or MD alternately in the Y direction (non-scan direction).

In the case of a mask MC of FIG. 7B, the partial pattern areas MB1 to MB3 are deviated in the Y direction with respect to the partial pattern areas MA1 to MA3 but arranged at the same position in the X direction, so the mask can be further minimized and ease of fabricating can be achieved. In contrast, in the case of a mask MD of FIG. 7C, the partial pattern areas MB1 to MB3 are deviated in the Y direction with respect to the partial pattern areas MA1 to MA3 and also deviated at a distance c in the X direction. In FIG. 7C, if the distance c is set to be close to the interval (distance between lenses) in the X direction between the illumination areas VA1 to VA3 and the illumination areas VB1 to VB3 shown in FIG. 6A, the movement range (movement stroke) of the mask MD in the X direction can be shortened.

An example of an operation to load the mask MC shown in FIG. 7B onto the mask stage MST of the exposure apparatus 1 shown in FIG. 1 and to expose the plate P will be described with reference to FIGS. 8A to 8E. For convenience of explanation, description will be provided as that exposure is performed while the plate P is being moved in the −X direction.

First, as shown in FIGS. 8A and 8B, the plate (not shown) is moved in the −X direction synchronously with movement of the partial pattern areas MA1 to MA3 of the mask MC in the −X direction with respect to the illumination areas VA1 to VA3, and the pattern formation areas of the plate are exposed at the exposure areas of the partial projection optical systems PLA1 to PLA3. After this exposure ends, as shown in FIG. 8C, the mask MC is moved in the −X direction until the partial pattern areas MB1 to MB3 come to the diagonally forward (obliquely front) side (in this case, the −X direction side) of the illumination areas VB1 to VB3 (at this time, illumination light is not irradiated, and the same is applied to the following description).

Thereafter, the mask stage MST is driven to move the mask MC in the +Y direction by an interval between the centers of the partial pattern areas MA1 and MB1 in the Y direction (step movement), as indicated by an arrow S1 in FIG. 8C. This is executed as an operation corresponding to Step 108 shown in FIG. 5. As a result, as shown in FIG. 8D, the partial pattern areas MB1 to MB3 of the mask MC are moved in front of the illumination areas VB1 to VB3.

Next, the plate (not shown) is moved in the −X direction synchronously with movement of the partial pattern areas MB1 to MB3 of the mask MC in the +X direction with respect to the illumination areas VB1 to VB3, and other pattern formation areas of the plate are exposed with the exposure areas of the partial projection optical systems PLB1 to PLB3. After this exposure ends, as shown in FIG. 8E, the mask MC is moved in the +X direction until the partial pattern areas MA1 to MA3 come to the diagonally forward side (in this case, the +X direction side) of the illumination areas VA1 to VA3.

Thereafter, the mask stage MST is driven to move the mask MC in the −Y direction by an interval between the centers of the partial pattern areas MA1 and MB1 in the Y direction, as indicated by an arrow S2 in FIG. 8E. This is executed as an operation corresponding to Step 112 in FIG. 5. As a result, as shown in FIG. 8A, the partial pattern areas MA1 to MA3 of the mask MC are moved in front of the illumination areas VA1 to VA3. Subsequently, before and after movement (step movement) of the mask MC in the Y direction, the images of the patterns in the partial pattern areas MA1 to MA3 and MB1 to MB3 of the mask MC are sequentially exposed in adjacent pattern formation areas on the plate P while reciprocating the mask MC along the X direction. As described above, when the mask MC is used in which the partial pattern areas MA1 to MA3 and MB1 to MB3 are at the same position in the Y direction, the mask can be further minimized, but it should suffice that the movement range of the mask MC in the X direction corresponds to the length obtained by adding the interval between the illumination areas VA1 to VA3 and VB1 to VB3 to the length of the partial pattern areas MA1 to MA3 (MB1 to MB3).

Next, an example of an operation to load a mask MD shown in FIG. 7C onto the mask stage MST of the exposure apparatus 1 shown in FIG. 1 and expose the plate P will be described with reference to FIGS. 9A to 9D.

First, as shown in FIG. 9A, the plate (not shown) is moved in the +X direction synchronously with movement of the partial pattern areas MA1 to MA3 of the mask MD in the +X direction with respect to the illumination areas VA1 to VA3, and the pattern formation area of the plate is exposed with the partial projection optical systems PLA1 to PLA3. In this case, the distance c between the partial pattern areas MA1 and MB1 is long, so when the exposure of the pattern formation areas ends, as shown in FIG. 9B, the partial pattern areas MB1 to MB3 are on the diagonally forward side (in this case, the +X direction side) of the illumination areas VB1 to VB3.

Thereafter, the mask stage MST is driven to move the mask MD in the +Y direction as indicated by an arrow S1 in FIG. 9B, the partial pattern areas MB1 to MB3 of the mask MD are moved in front of the illumination areas VB1 to VB3, as shown in FIG. 9C. Next, the plate (not shown) is moved in the +X direction synchronously with movement of the partial pattern areas MB1 to MB3 of the mask MD in the −X direction with respect to the illumination areas VB1 to VB3, and other pattern formation areas of the plate are exposed with the partial projection optical systems PLB1 to PLB3. When this exposure ends, as shown in FIG. 9D, the partial pattern areas MA1 to MA3 are located on the diagonally forward side (in this case, the −X direction side) of the illumination areas VA1 to VA3.

Thereafter, the mask stage MST is driven to move the mask MD in the −Y direction as indicated by an arrow S2 in FIG. 9D, the partial pattern areas MA1 to MA3 of the mask MD are moved in front of the illumination areas VA1 to VA3, as shown in FIG. 9A. Subsequently, before and after movement of the mask MD in the Y direction, the images of the patterns in the partial pattern areas MA1 to MA3 and MB1 to MB3 of the mask MD can be sequentially exposed in adjacent pattern formation areas on the plate P while reciprocating the mask MD in the X direction. As described above, when the distance c between the partial pattern areas MA1 to MA3 and MB1 to MB3 in the X direction is close to the distance between the illumination areas VA1 to VA3 and VB1 to VB3, the movement range of the mask MD in the X direction can be substantially shortened to the length of the partial pattern areas MA1 to MA3 (MB1 to MB3).

Although the partial pattern areas MA1 to MA3 and MB1 to MB3 are formed in a single mask, the partial pattern areas MA1 to MA3 may be formed in a first mask and the partial pattern areas MB1 to MB3 may be formed in other (different) second mask. In addition, the partial pattern areas MA1 to MA3 and MB1 to MB3 may be dividedly formed in two or more masks. In these cases, a plurality of masks is scanned by a common mask stage.

[Second Embodiment]

Next, a second embodiment of the invention will be described with reference to FIGS. 10 to 17. An exposure apparatus 1A of this embodiment is different from the exposure apparatus 1 shown in FIG. 1 in that a projection optical apparatus PL is used in which two projection optical systems PLC and PLD can be alternately switched. In FIGS. 10 to 14, the portions corresponding to FIGS. 1 to 4 are represented by the same or similar reference numerals, and detailed description thereof is omitted. The projection magnification β of the projection optical systems PLC and PLD of this embodiment is greater than or equal to 2× magnification.

FIG. 10 is a perspective view showing a main part when the exposure apparatus 1A of this embodiment uses a projection optical apparatus PL as a first projection optical system PLC. In FIG. 10, the exposure apparatus 1A includes a mask stage (not shown) which holds a mask ME and moves the mask ME in the X direction and the Y direction, an illumination unit (not shown) which illuminates three illumination areas VA1 to VA3 substantially arranged on the mask ME at a predetermined interval in the Y direction, a projection optical apparatus PL which projects the images of the patterns in the illumination areas VA1 to VA3 onto the plate P at a projection magnification β (β≧2), a plate moving apparatus PDVA (see FIG. 11) which moves a sheet-shaped plate P wound in a roll shape in the −Z direction and then moves this plate P in the +X direction, alignment sensors (not shown), a main control system (not shown), and the like. In FIG. 10, the projection optical apparatus PL functions as a first projection optical system PLC which is composed of partial projection optical systems PLC1 to PLC3 and projects the images of the patterns in the illumination areas VA1 to VA3 on the object plane parallel to the XY plane onto the exposure areas IA1 to IA3 on the plate P which is being moved in the +X direction on the image plane parallel to the XY plane.

In this case, the central illumination area VA2 is deviated in the −X direction from the illumination areas VA1 and VA3 at both ends at a predetermined distance. The partial projection optical systems PLC1 to PLC3 project an erected image in the X direction (scan direction) and an inverted image in the Y direction. In addition, the central exposure area IA2 is deviated in the −X direction from the exposure areas IA1 and IA3 at both ends at a predetermine distance. The entire surface of the pattern formation area 14A of the plate P can be stitched in the Y direction and scan exposed at the exposure areas IA1 to IA3.

As shown in FIG. 14, a first set of partial pattern areas MA1, MA2, and MA3 arranged in the Y direction at a predetermined interval and a second set of partial pattern areas MF1, MF2, and MF3 arranged alternately with the partial pattern areas MA1, MA2, and MA3 are formed in the mask ME of this embodiment. Similarly to the first embodiment, partial patterns are formed in the partial pattern areas MA1 to MA3, in which the partial pattern is obtained by reducing the pattern which should be transferred onto the plate P 1/β (β is projection magnification), and dividing into three partial patterns in the Y direction, and then individually inverting in the Y direction. Partial patterns obtained by inverting the patterns of the partial pattern areas MA1 to MA3 in the X direction are formed in the partial pattern areas MF1 to MF3. In FIG. 10, the partial pattern areas MA1 to MA3 of the mask ME are scanned in the +X direction with respect to the illumination areas VA1 to VA3. In this embodiment, the positions of the partial pattern areas MA1 to MA3 in the X direction may differ such that the images of the patterns in the partial pattern areas MA1 to MA3 are stitched and exposed in adjacent areas on the plate P. The same is applied to the partial pattern areas MF1 to MF3.

Figure 11:
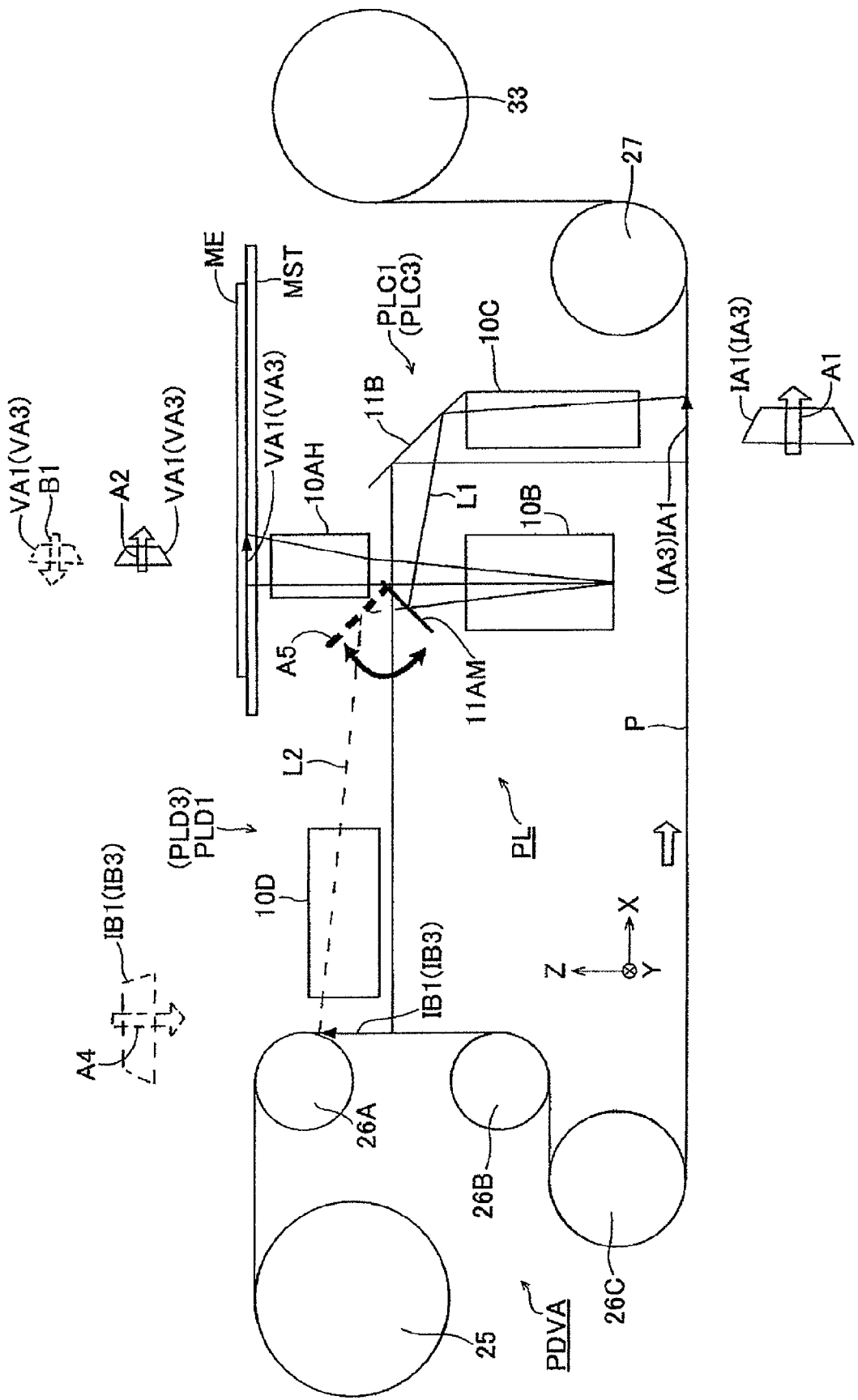
FIG. 11 is a view showing a main part including a partial projection optical system PLC1 (PLD1) of the exposure apparatus shown in FIG. 10.
Figure 12:
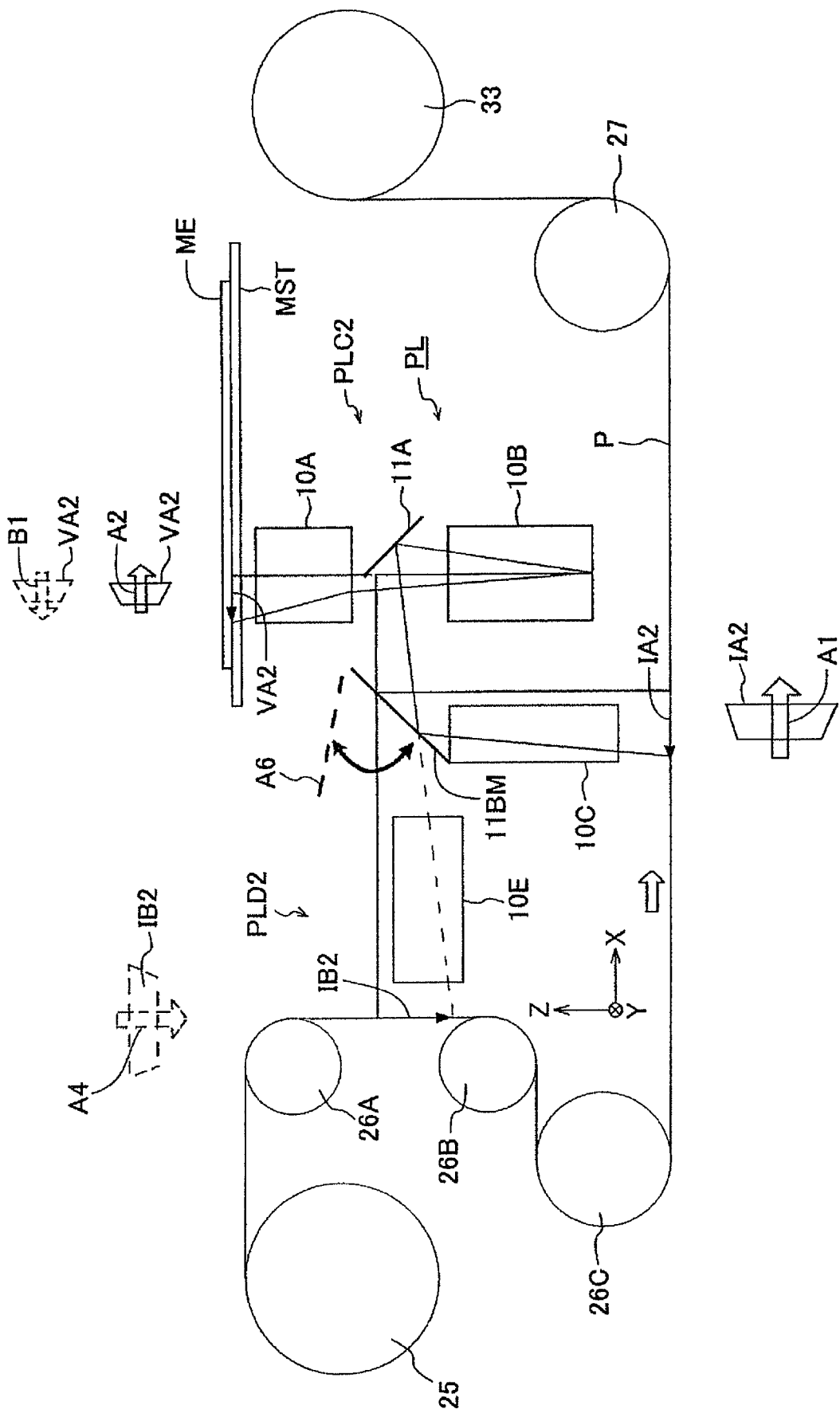
FIG. 12 is a view showing a main part including a partial projection optical system PLC2 (PLD2) of the exposure apparatus shown in FIG. 10.

FIG. 11 is a front view of a main part including the partial projection optical system PLC1 and the like at the ends shown in FIG. 10. FIG. 12 is a front view of a main part including a central partial projection optical system PLC2 and the like shown in FIG. 10. As shown in FIG. 11, the plate moving apparatus PDVA includes a supply roller 25 which winds off the sheet-shaped plate P, two rollers 26A and 26B which move the plate P in the −Z direction at a predetermined speed, two rollers 26C and 27 which move the plate P in the +X direction at a predetermined speed, two exposure stages (not shown) whose surfaces function as a travel path of the plate P, which is exposed at the exposure area IA1 and the like, and a wind-up roller 33 which winds-up the plate P.

The projection optical system PLC1 also includes a first optical system 10AH which receives illumination light from the illumination area VA1 and the −X direction side thereof is cut out, a catadioptric optical system 10B which reflects illumination light from the first optical system 10AH to the +Z direction, a movable mirror 11AM which bends illumination light from the catadioptric optical system 10B to the +X direction along an optical path L1, a mirror 11B which bends the bent illumination light to the −Z direction, and a second optical system 10C which guides illumination light from the mirror 11B to the exposure area IA1 on the plate P. The optical axis of the second optical system 10C is parallel to the Z axis. Similarly to the partial projection optical system PLAT shown in FIG. 2, the partial projection optical system PLC1 forms an image of the pattern of the illumination area VA1 in the exposure area IA1 to be erected in the X direction and inverted in the Y direction. The configuration of the partial projection optical system PLC3 is the same as that of the partial projection optical system PLC1. At the time of scan exposure, the mask ME is scanned in the +X direction with respect to the illumination areas VA1 and VA3 as indicated by an arrow A2, and the plate P is scanned in the +X direction with respect to the exposure areas IA1 and IA3 as indicated by an arrow A1. The scan speed of the plate P is β (β is projection magnification) times of the scan speed of the mask ME.

The movable mirror 11AM is rotated to a position A5 by 90° in the clockwise direction via a drive section (not shown), such that the projection optical systems PLC1 and PLC3 are respectively switched to the projection optical systems PLD1 and PLD3. The projection optical system PLD1 includes a first optical system 10AH which receives illumination light from the illumination area VA1, a catadioptric optical system 10B which reflects illumination light from the first optical system 10AH to the +Z direction, a movable mirror 11AM (position A5) which bends illumination light from the catadioptric optical system 10B to the −X direction along an optical path L2 shown in dotted line, and a third optical system 10D which guides the bent illumination light to the exposure area IB1 of the plate P parallel to the YZ plane. The optical axis of the third optical system 10D is parallel to the X axis, and the substantially half side of the third optical system 10D in the −Z direction from the optical axis is cut out. The partial projection optical system PLD1 forms an image of the pattern of the illumination area VA1 in the exposure area IB1 to be inverted in the Z direction and the Y direction. The configuration of the partial projection optical system PLD3 which forms an image of the pattern of the illumination area VA3 in the exposure area IB3 is the same as that of the partial projection optical system PLD1. At the time of scan exposure, the mask ME is scanned in the −X direction with respect to the illumination areas VA1 and VA3 as indicated by an arrow B1, and the plate P is scanned in the −Z direction with respect to the exposure areas IB1 and IB3 as indicated by an arrow A4.

Although in FIG. 12, the partial projection optical system PLC2 has a configuration that the partial projection optical system PLC1 shown in FIG. 11 is substantially rotated by 180°, but is different from the partial projection optical system PLC1 in that the first optical system 10A is provided instead of the first optical system 10AH, and the fixed mirror 11A and the movable mirror 11BM are provided instead of the movable mirror 11AM and the fixed mirror 11B. The partial projection optical system PLC2 forms an image of the pattern of the illumination area VA2 in the exposure area IA2 to be erected in the X direction and inverted in the Y direction. At the time of scan exposure, the mask ME is scanned in the +X direction with respect to the illumination area VA2 as indicated by an arrow A2, and the plate P is scanned in the +X direction with respect to the exposure area IA2 as indicated by an arrow A1.

The movable mirror 11BM is rotated in the clockwise direction via the drive section (not shown) to be retracted to a position A6, such that the projection optical apparatus PL is switched to the projection optical system PLD2. The projection optical system PLD2 includes a first optical system 10A which receives illumination light from the illumination area VA1, a catadioptric optical system 10B which reflects illumination light from the first optical system 10A to the +Z direction, a mirror 11A which bends illumination light from the catadioptric optical system 10B to the −X direction, and a third optical system 10E which guides illumination light to the exposure area IB2 on the plate P as indicated by a dotted line. The optical axis of the third optical system 10E is parallel to the X axis, and the substantially half side of the third optical system 10E in the +Z direction from the optical axis is cut out. The partial projection optical system PLD2 forms an image of the pattern of the illumination area VA2 in the exposure area IB2 to be inverted in the Z direction and the Y direction. At the time of scan exposure, the mask ME is scanned in the −X direction with respect to the illumination area VA2 as indicated by an arrow B1, and the plate P is scanned in the −Z direction with respect to the exposure area IB2 as indicated by an arrow A4.

Figure 13:
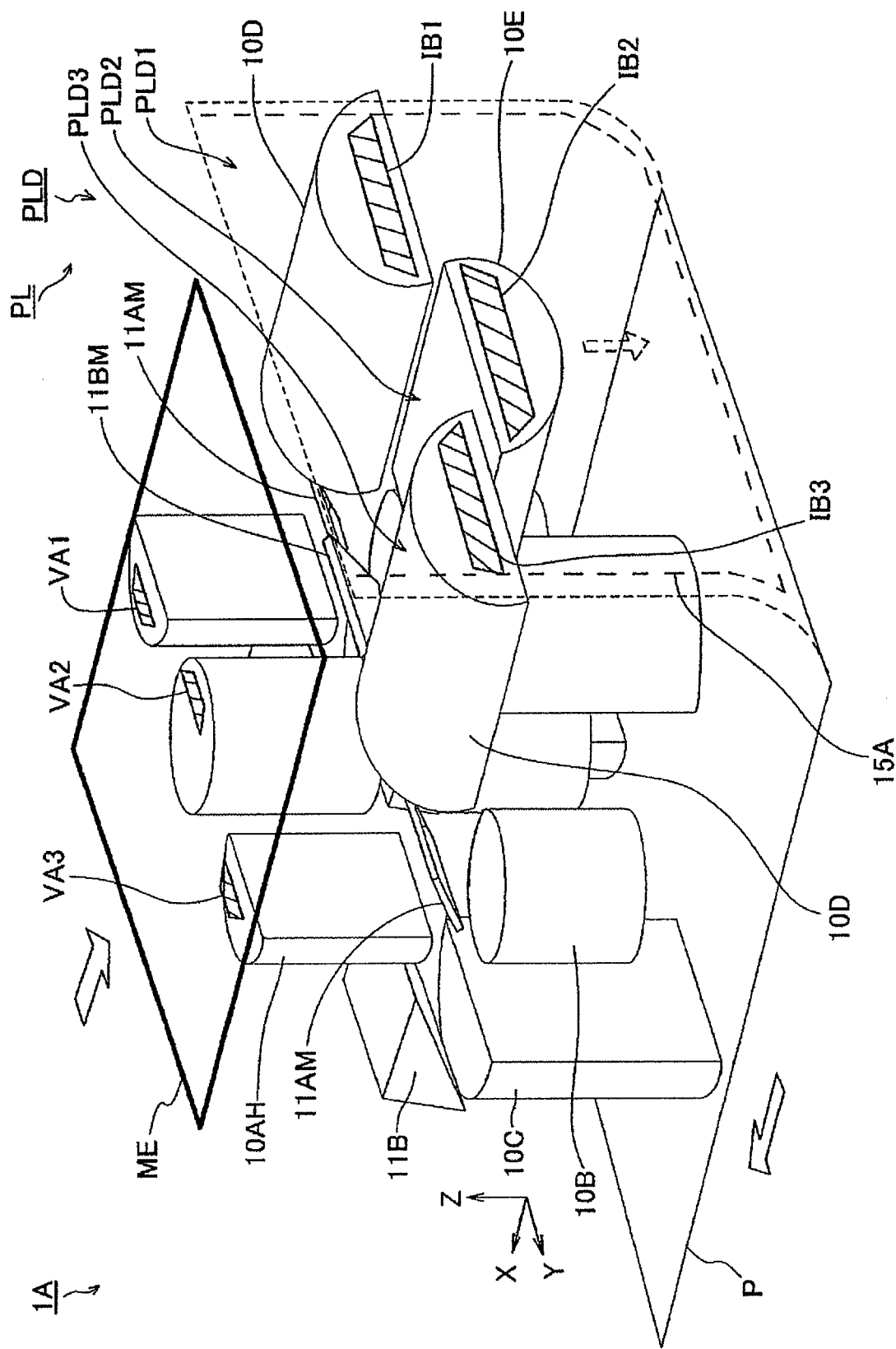
FIG. 13 is a perspective view showing a main part of the exposure apparatus of the second embodiment which uses a second projection optical system PLD.

FIG. 13 shows a main part when the projection optical apparatus PL in the exposure apparatus 1A shown in FIG. 10 is switched to the second projection optical system PLD which is composed of partial projection optical system PLD1 to PLD3. In FIG. 13, the movable mirrors 11AM at both ends and the central movable mirror 11BM are rotated upward, and the images of the patterns in the illumination areas VA1 to VA3 of the mask ME formed by the partial projection optical systems PLD1 to PLD3 are projected onto the exposure areas IB1 to IB3 on the plate P, which is moved in the −Z direction. The central exposure area IB2 is arranged to be deviated in the −Z direction with respect to the exposure areas IB1 and IB3 at both ends, and the entire surface of the pattern formation area 15A of the plate P can be stitched in the Y direction and exposed at the exposure areas IB1 to IB3. The half sides of the third optical systems 10D and 10E are cut out, so the third optical systems 10D and 10E, and consequently, the exposure areas IB1 to IB3 can be arranged to be close to the Z direction (in this case, the scan direction of the plate P).

In FIG. 13, the partial pattern areas MF1 to MF3 of the mask ME shown in FIG. 14 are scanned in the −X direction with respect to the illumination areas VA1 to VA3. As described above, in this embodiment, the plate P is moved in the +X direction with respect to the exposure area of the projection optical system PLC shown in FIG. 10, and the plate P is moved in the −Z direction with respect to the exposure area of the projection optical system PLD shown in FIG. 13. However, the movement direction of the plate P with respect to the exposure areas of the projection optical system PLC and PLD is constantly uniform.

Figure 16A:
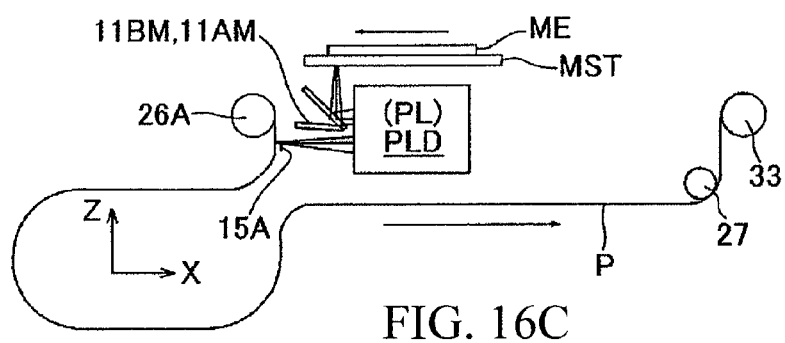
FIGS. 16A, 16C, 16E, and 16G are views showing a main part regarding switching of projection optical systems and movement of a plate in the exposure apparatus of the second embodiment.
Figure 16B:
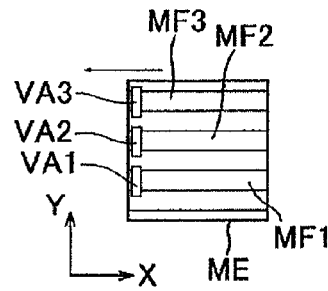
FIGS. 16B, 16D, 16F, and 16H are views conceptually showing an example of change in the relative positions of a mask and an illumination area in the second embodiment.

An example of an exposure operation of the exposure apparatus 1A of this embodiment will be described with reference to FIGS. 15A to 15D, 16A to 16H, and 17A to 17H. FIGS. 15A to 15D show changes in the relative positions of the illumination areas VA1 to VA3 and the mask ME shown in FIG. 10. FIGS. 16A, 16C, 16E, 16G, 17A, 17C, 17E, and 17G are simplified views of the exposure apparatus shown in FIG. 11 or FIG. 12. FIGS. 16B, 16D, 16F, 16H, 17B, 17D, 17F, and 17H are views showing changes in the relative positions of the illumination areas VA1 to VA3 and the mask ME. In FIGS. 16B, 17B and the like, the arrangement of the partial pattern areas MA1 to MA3 and MF1 to MF3 is changed from the arrangement of FIG. 14.

For convenience of explanation, it is assumed that, as shown in FIGS. 15C and 16B, exposure of the plate P starts from a process of scanning the partial pattern areas MF1 to MF3 of the mask ME in the −X direction with respect to the illumination areas VA1 to VA3. In this case, as shown in FIG. 16A, by switching the movable mirrors 11AM and 11BM, the projection optical apparatus PL is switched to the second projection optical system PLD, and the patterns of the partial pattern areas MF1 to MF3 of the mask ME are scan-exposed in the pattern formation area 15A of the plate P, which is being moved in the −Z direction, via the projection optical system PLD.

Figure 16C:
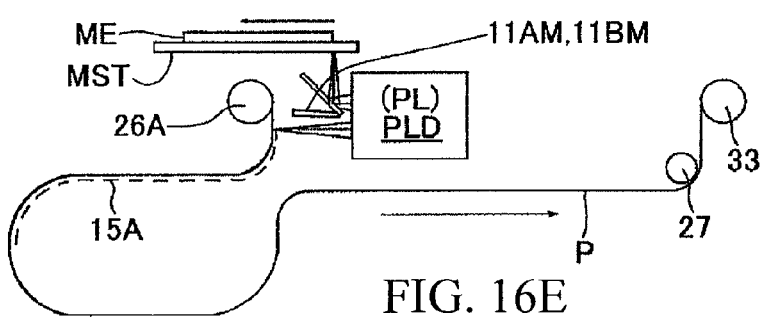
Figure 16D:
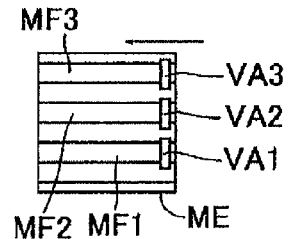
Figure 16E:
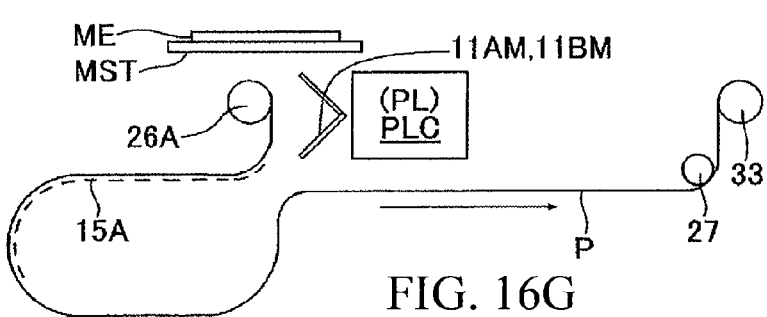
Figure 16F:
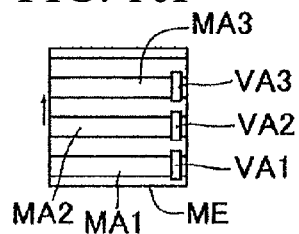

Thereafter, in FIGS. 15D and 16D, when scanning of the partial pattern areas MF1 to MF3 of the mask ME ends, in FIG. 16C, exposure of the pattern formation area 15A of the plate P indicated by a dotted line ends, and the mask ME is stopped. Thereafter, as shown in FIG. 16E, by switching of the movable mirrors 11AM and 11BM, the projection optical apparatus PL is switched to the first projection optical system PLC. Then, as indicated by an arrow S2 shown in FIG. 15D, the mask ME is moved in the −Y direction, and the partial pattern areas MA1 to MA3 are moved in front of the illumination areas VA1 to VA3 (see FIG. 16F). In FIG. 16F, the arrangement of the partial pattern areas MA1 to MA3 and MF1 to MF3 is changed, so the movement direction of the mask ME is reversed (opposed) (see FIGS. 17B and 17F).

Figure 16G:
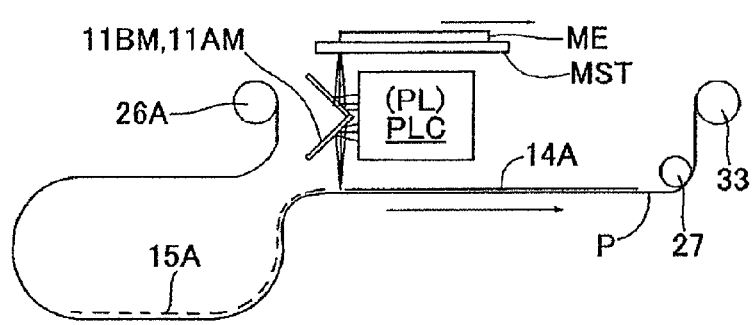
Figure 16H:
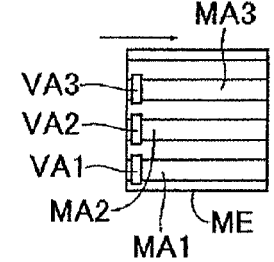

Next, as shown in FIG. 15A, scanning of the partial pattern areas MA1 to MA3 of the mask ME in the +X direction with respect to the illumination areas VA1 to VA3 starts, and the pattern formation area 14A indicated by a solid line in FIG. 16G which is in front of the pattern formation area 15A on the plate P is subjected to scan exposure via the first projection optical system PLC. Thereafter, as shown in FIGS. 15B and 16H, when scanning of the partial pattern areas MA1 to MA3 of the mask ME ends, exposure of the pattern formation area 15A ends, and the mask ME is stopped.

Figure 17A:
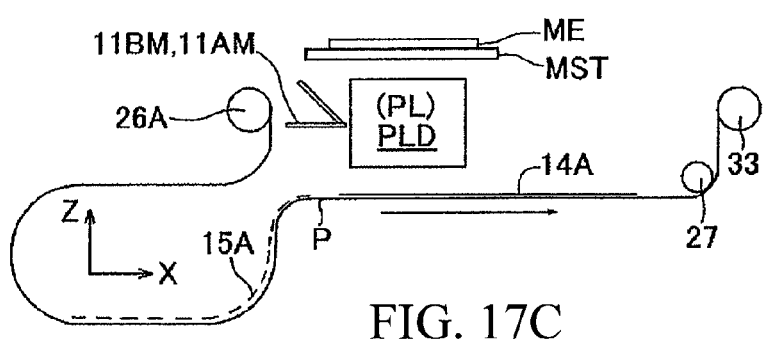
FIGS. 17A, 17C, 17E, and 17G are views showing a main part regarding switching of projection optical systems and movement of a plate in the exposure apparatus, which follow FIG. 16C.
Figure 17B:
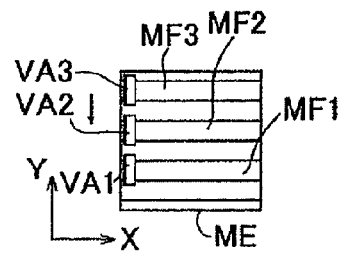
FIGS. 17B, 17D, 17F, and 17H are views conceptually showing an example of change in the relative positions of a mask and an illumination area, which follow FIG. 16H.

Thereafter, as shown in FIG. 17A, by switching the movable mirrors 11AM and 11BM, the projection optical apparatus PL is switched to the second projection optical system PLD. Then, as indicated by an arrow S1 in FIG. 15B, the mask ME is moved in the +Y direction, such that the partial pattern areas MF1 to MF3 are moved in front of the illumination areas VA1 to VA3 (see FIG. 17D).

Figure 17C:
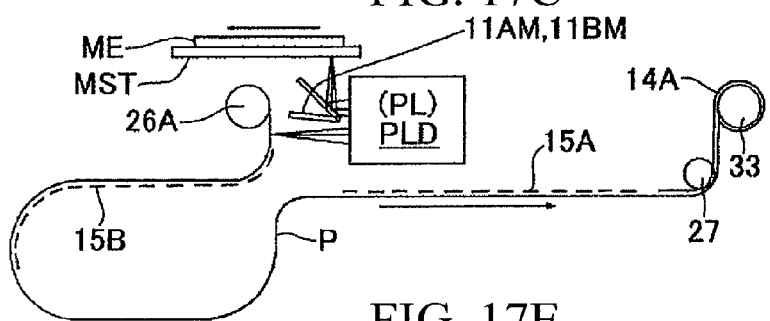
Figure 17D:
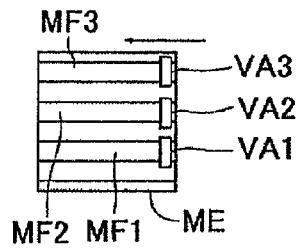
Figure 17E:
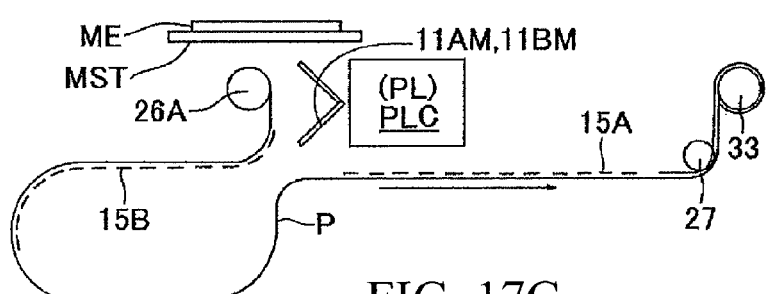
Figure 17F:
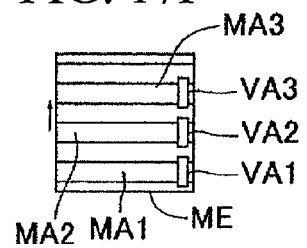

Next, as shown in FIG. 15C, scanning of the partial pattern areas MF1 to MF3 of the mask ME in the −X direction with respect to the illumination areas VA1 to VA3 starts, and the next pattern formation area 15B on the plate P indicated by a dotted line in FIG. 17C is subjected to scan exposure via the second projection optical system PLD. Thereafter, as shown in FIG. 15D, when scanning of the partial pattern areas MF1 to MF3 of the mask ME ends, exposure of the pattern formation area 15B ends, and the mask ME is stopped. Thereafter, as shown in FIG. 17E, by switching the movable mirrors 11AM and 11BM, the projection optical apparatus PL is switched to the first projection optical system PLC. Then, as indicated by an arrow S2 in FIG. 15D, the mask ME is moved in the −Y direction, such that the partial pattern areas MA1 to MA3 are moved in front of the illumination areas VA1 to VA3 (see FIG. 17F).

Figure 17G:
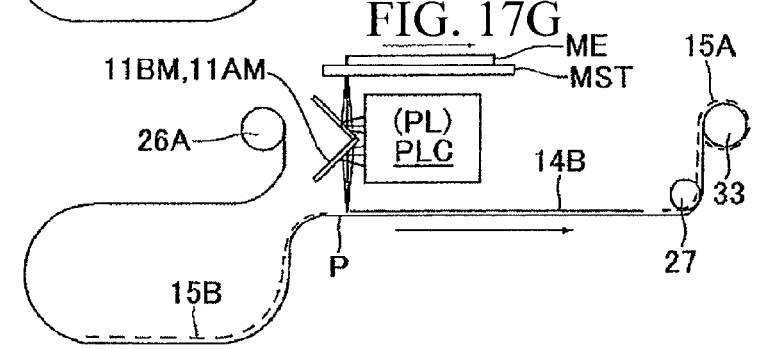
Figure 17H:
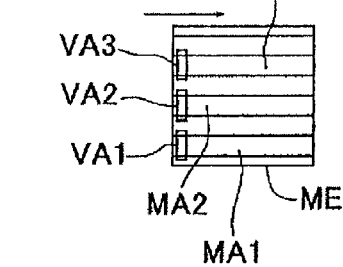

Next, as shown in FIG. 15A, scanning of the partial pattern areas MA1 to MA3 of the mask ME in the +X direction with respect to the illumination areas VA1 to VA3 starts, and the pattern formation area 14B indicated by a solid line in FIG. 17G which is in front of the pattern formation area 15B on the plate P is subjected to scan exposure via the first projection optical system PLC. Thereafter, as shown in FIGS. 15B and 17H, when scanning of the partial pattern areas MA1 to MA3 of the mask ME ends, exposure of the pattern formation area 14B ends, and the mask ME is stopped.

Subsequently, as shown in FIGS. 16A to 17H, reciprocation of the mask ME in the X direction and scan exposure of the plate P by the projection optical systems PLC and PLD during reciprocation are repeated, such that the enlarged images of the partial pattern areas MA1 to MA3 and the enlarged images of the partial pattern areas MF1 to MF3 of the mask ME are respectively exposed in the pattern formation areas 14A, 15A, 14B, 15B, . . . which are arranged alternately over the entire length of the plate P.

The advantages of this embodiment are as follows.

(1) According to the exposure apparatus 1A (exposure method) of this embodiment, the plate P which is moved in a predetermined direction can be exposed alternately via two projection optical systems PLC and PLD during reciprocation of the mask ME in the X direction (scan direction). Therefore, even when the plate P is a long sheet-shaped photosensitive object which is flexible, exposure can be efficiently performed for a sequence of pattern formation areas 14A, 15A and the like on the plate P while moving the plate P in a predetermined direction continuously.

In this embodiment, the plate P may be moved intermittently.

(2) The partial projection optical systems PLC1 and PLC3 of the first projection optical system PLC and the partial projection optical systems PLD1 and PLD3 of the second projection optical system PLD includes the first optical system 10AH and the catadioptric optical system 10B as a common optical system. The partial projection optical systems PLC1 and PLC3 and the partial projection optical systems PLD1 and PLD3 respectively include the unique second optical system 10C and third optical system 10D, and the movable mirror 11AM is provided which switches and guides illumination light from the common optical system to the second optical system 10C or the third optical system 10D.

Similarly, the partial projection optical system PLC2 of the first projection optical system PLC and the partial projection optical system PLD2 of the second projection optical system PLD includes the first optical system 10A, the mirror 11A, and the catadioptric optical system 10B as common optical systems. The partial projection optical system PLC2 and the partial projection optical system PLD2 respectively include the second optical system 10C and third optical system 10E, and the movable mirror 11BM is provided which switches and guides illumination light from the common optical systems to the second optical system 10C or the third optical system 10E.

Therefore, during a period in which the mask ME is moving in the +X direction, by switching the movable mirrors 11AM and 11BM, illumination light from the common optical system is guided to the unique second optical system 10C and the first projection optical system PLC is formed. During a period in which the mask ME is moving in the −X direction, by switching the movable mirrors 11AM and 11BM, illumination light from the common optical system is guided to the unique third optical system 10D and 10E, and the second projection optical system PLD is formed. Therefore, the two projection optical systems PLC and PLD can be reduced in size as a whole, and the plate P can be exposed during the reciprocation of the mask ME. In addition, it should suffice that the illumination areas VA1 to VA3 for one projection optical system are illuminated, so an illumination unit can also be reduced in size.

Between the period in which the mask ME is moved in the +X direction to perform scan exposure on the plate P and the period in which the mask ME is moved in the −X direction to perform scan exposure on the plate P, the projection optical system PLC and the projection optical system PLD can be switched by switching the movable mirrors 11AM and 11BM.

(3) The optical axis on the plate P of the unique second optical system 10C of the partial projection optical systems PLC1 to PLC3 of the first projection optical system PLC is parallel to the Z axis, and the optical axis on the plate P of the unique third optical system 10D and 10E of the partial projection optical systems PLD1 to PLD3 of the second projection optical system PLD is parallel to the X axis. The two optical axes are orthogonal to each other. The plate P is a sheet-shaped member which is flexible, and the transfer direction of the plate P between the exposure areas IA1 to IA3 of the second optical system 10C and the exposure areas IB1 to IB3 of the third optical system 10D and 10E is changed from the −Z direction to the +X direction. Therefore, exposure can be alternately performed for adjacent pattern formation areas on the plate P via the two projection optical systems PLC and PLD while moving the plate P in a predetermined direction.

(4) A fixed half mirror may be provided instead of the movable mirrors 11AM and 11BM, and the exposure areas of the first projection optical system PLC and the second projection optical system PLD may simultaneously be exposed with illumination light from the mask ME. In this case, shutters may be respectively provided at two emission portions of luminous fluxes from the half mirrors. The projection optical systems PLC and PLD may alternately be used by opening and closing the shutters.

A predetermined pattern (circuit pattern or electrode pattern) is formed on the plate P using the exposure apparatus 1 or 1A of the foregoing embodiment, such that plural liquid crystal display devices can be obtained as a micro-device. Hereinafter, an example of a method for fabricating a micro-device will be described with reference to a flowchart of FIG. 18.

Figure 18:
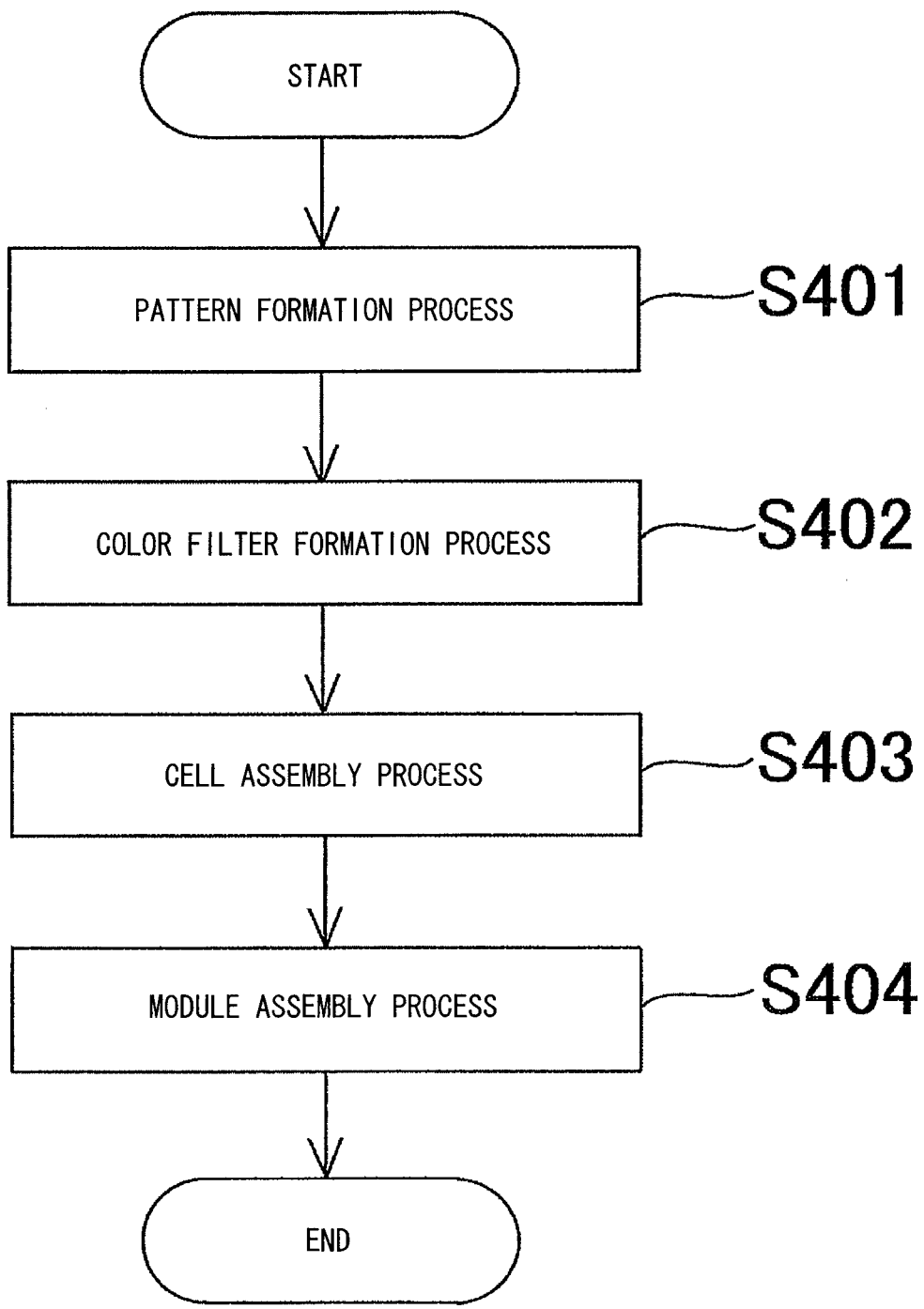
FIG. 18 is a flowchart showing an example of a method for fabricating a micro-device.

In Step S401 (pattern formation process) of FIG. 18, first, a coating process for coating (applying) photoresist to the sheet-shaped plate as an exposure target to prepare a photosensitive substrate, an exposure process for transferring and exposing the patterns of the mask for a liquid crystal display device to plural pattern formation areas on the photosensitive substrate using the exposure apparatus, and a development process for developing the photosensitive substrate are executed. With a lithography process including the coating process, the exposure process, and the development process, a predetermined resist pattern is formed on the plate. Subsequent to the lithography process, an etching process with the resist pattern as a mask, a resist removing process, and the like are executed, such that a predetermined pattern including plural electrodes and the like is formed on the plate. The lithography process and the like are executed plural times in accordance with the number of layers on the plate.

In Step S402 (color filter formation process), color filters are formed by arranging a large number of groups of three micro filters corresponding to red R, green G, and blue B in a matrix pattern, or by arranging a plurality of filter groups which have three-stripe shape of red R, green G, and blue B in a horizontal scan line direction. In the next Step S403 (cell assembly process), for example, liquid crystals are injected between the plate having a predetermined pattern obtained in Step S401 and the color filters obtained in Step S402, such that a liquid crystal panel (liquid crystal cell) is fabricated (manufactured).

In the next Step S404 (module assembly process), members such as electric circuits and backlights and the like that are used to perform a display operation are attached to the large number of liquid crystal panels (liquid crystal cells) which is assembled in this manner, and the liquid crystal display elements are complete. The above described fabricating method of a liquid crystal display device includes a process for exposing the pattern of the mask onto the photosensitive substrate using the exposure apparatus of the above-described embodiment, and a process for performing development and the like for the photosensitive substrate which is exposed by the above process. Therefore, exposure can be efficiently performed efficiently, so throughput of the device fabricating process can be improved.

In the embodiment shown in FIG. 1, for example, a resist coater may be provided between the supply roller 25 and the roller 26, and a resist developer may be provided between the roller 27 and the wind-up roller 33.

In the above-described embodiments, the long sheet-shaped member which is flexible is used as an exposure target plate. However, as a plate, it is also possible to use a rectangular flat plate-shaped glass plate having comparatively high rigidity which is used for fabricating a liquid crystal display element or the like, a ceramics substrate which is used for fabricating a thin-film magnetic head, or a circular semiconductor wafer which is used for fabricating a semiconductor element.

A device which can be fabricated using the exposure apparatus 1 or 1A of the foregoing embodiment is not limited to a liquid crystal display element, and it may include a display device, such as an organic EL display. In addition to the display device, a device including at least a part of the plate P can be fabricated by transferring the pattern of the mask onto the plate P using the exposure apparatus 1 or 1A of the embodiment, and processing the plate P to which the pattern has been transferred based on the pattern. Here, the processing of the plate P based on the transferred pattern may include etching the plate P based on the transferred pattern, printing the plate P based on the transferred pattern (coating a predetermined material, such as conductive ink, based on the transferred pattern), or the like.

In the above-described embodiments, a discharge lamp is provided as an exposure light source, and necessary g-ray, h-ray, and i-ray light is selected. However, the invention is not limited thereto, and the invention can still be applied in a case where light from an ultraviolet LED, laser light from KrF excimer laser (248 nm) or ArF excimer laser (193 nm), or a harmonic wave of a solid state laser (semiconductor laser or the like), for example, a triple harmonic wave (wavelength 355 nm) of YAG laser, or the like is used as exposure light.

As described above, the invention is not limited to the above-described embodiments, and various kinds of configuration may be made without departing from the scope of the invention.

The invention claimed is:

1. An exposure method for projecting an image of a pattern of a mask onto a substrate and exposing the substrate, the method comprising:
   reciprocating the mask along a first direction;
   synchronizing a movement of the mask and a movement of the substrate to a second direction along a surface of the substrate;
   illuminating a first illumination area of the mask to illuminate a portion of a first pattern of the mask while closing the first illumination area in areas other than the illuminated portion of the first pattern of the mask;
   projecting an image of the first pattern of the mask with the first illumination area onto the substrate as an erected image with respect to the second direction during a first period in which the mask is moving to one side of the first direction; and
   projecting an image of a second pattern of the mask onto the substrate as an inverted image with respect to the second direction during a second period in which the mask is moving to the other side of the first direction.

2. The exposure method according to claim 1, wherein
   an optical path for exposing the substrate during the first period is at least partially different from an optical path for exposing the substrate during the second period.

3. An exposure method for projecting an image of a pattern of a mask onto a substrate and exposing the substrate, the method comprising:
   reciprocating the mask along a first direction;
   synchronizing a movement of the mask and a movement of the substrate to a second direction along a surface of the substrate;
   projecting an image of a first pattern of the mask onto the substrate as an erected image with respect to the second direction, during a first period in which the mask that is reciprocating is moved to one side of the first direction; and
   projecting an image of a second pattern of the mask onto the substrate as an inverted image with respect to the second direction, during a second period in which the mask that is reciprocating is moved to the other side of the first direction,
   wherein an optical path for exposing the substrate during the first period is at least partially different from an optical path for exposing the substrate during the second period, and
   wherein exposure of the substrate is performed by projecting an image of a pattern within a first illumination area or a different second illumination area on the mask onto an exposure area of the substrate, the exposure method comprising:
   opening and closing the first illumination area of the mask or a conjugate area thereof during the first period; and
   opening and closing the second illumination area of the mask or a conjugate area thereof during the second period.

4. An exposure method for projecting an image of a pattern of a mask onto a substrate and exposing the substrate, the method comprising:

reciprocating the mask along a first direction;

synchronizing a movement of the mask and a movement of the substrate to a second direction along a surface of the substrate;

projecting an image of a first pattern of the mask onto the substrate as an erected image with respect to the second direction, during a first period in which the mask that is reciprocating is moved to one side of the first direction; and projecting an image of a second pattern of the mask onto the substrate as an inverted image with respect to the second direction, during a second period in which the mask that is reciprocating is moved to the other side of the first direction, wherein an optical path for exposing the substrate during the first period is at least partially different from an optical path for exposing the substrate during the second period, and wherein a first projection optical path for projecting the erected image onto the substrate and a second projection optical path for projecting the inverted image onto the substrate have a common optical path on the mask side, and wherein the exposure method comprises switching the first projection optical path to the second projection optical path, in a meantime after exposure of the substrate during the first period ends before exposure of the substrate during the second period starts.

5. The exposure method according to claim 1, wherein the first pattern and the second pattern of the mask are arranged so as to be shifted in a direction intersecting the first direction; and the exposure method comprises moving the mask in the direction intersecting the first direction between the first period and the second period.

6. The exposure method according to claim 1, wherein a magnification of the erected image and the inverted image is at least 2× magnification; and the first pattern and the second pattern of the mask are arranged alternately in a direction intersecting the first direction.

7. The exposure method according to claim 1, further comprising:

winding up the substrate by moving the substrate in the second direction.

8. The exposure method according to claim 1, wherein the first pattern and the second pattern of the mask are inverted with respect to the first direction.

9. The exposure method according to claim 1, further comprising:

preparing the mask in which the first pattern and the second pattern are inverted with respect to the first direction.

10. The exposure method according to claim 1, wherein the erected image includes a plurality of images arranged in a direction intersecting the second direction; and the inverted image includes a plurality of images arranged in a direction intersecting the second direction.

11. An exposure method for exposing a substrate via a pattern of a mask, the exposure method comprising:

illuminating a first illumination area of the mask to illuminate a portion of a first pattern of the mask while closing the first illumination area in areas other than the illuminated portion of the first pattern of the mask;

exposing, with the first illumination area, a first area of the substrate via the first pattern of the mask and a first projection optical system which projects an erected image with respect to a second direction, while synchronizing a movement of the mask to one side along a first direction and a movement of the substrate to the second direction; and exposing a second area of the substrate via a second pattern of the mask and a second projection optical system which projects an inverted image with respect to the second direction, while synchronizing a movement of the mask to the other side along the first direction and a movement of the substrate to the second direction.

12. The exposure method according to claim 11, wherein the mask reciprocates along the first direction; and the substrate is moved in the second direction continuously or intermittently.

13. The exposure method according to claim 11, wherein the mask is moved in a direction intersecting the first direction between exposure of the first area of the substrate and exposure of the second area.

14. A method for fabricating a device comprising:

exposing a photosensitive substrate using an exposure method according to claim 1; and processing the exposed photosensitive substrate.

15. An exposure apparatus comprising:

a mask stage which holds a mask having a first pattern and a second pattern and reciprocates in a first direction;

an exposure light source configured to illuminate a first illumination area of the mask to illuminate a portion of the first pattern while closing the first illumination area in areas other than the illuminated portion of the first pattern;

a substrate movement mechanism which holds a substrate and moves the substrate to a second direction along a surface of the substrate;

a control system which synchronously drives the mask stage and the substrate movement mechanism;

a first projection optical system which projects an image of the first pattern of the mask, which is moved to one side of the first direction by the mask stage, onto the substrate as an erected image with respect to the second direction; and a second projection optical system which projects an image of the second pattern of the mask, which is moved to the other side of the first direction by the mask stage, onto the substrate as an inverted image with respect to the second direction.

16. An exposure apparatus comprising:

a mask stage which holds a mask having a pattern and reciprocates in a first direction;

a substrate movement mechanism which holds a substrate and moves the substrate to a second direction along a surface of the substrate;

a control system which synchronously drives the mask stage and the substrate movement mechanism;

a first projection optical system which projects an image of a first pattern of the mask, which is moved to one side of the first direction by the mask stage, onto the substrate as an erected image with respect to the second direction; and a second projection optical system which projects an image of a second pattern of the mask, which is moved to the other side of the first direction by the mask stage, onto the substrate as an inverted image with respect to the second direction, wherein the first and second projection optical systems project images of patterns within a first illumination area and a different second illumination areas on the mask onto the substrate, the exposure apparatus comprising a first field diaphragm which opens and closes the first illumination area of the mask or a conjugate area thereof, and a second field diaphragm which opens and closes the second illumination area of the mask or a conjugate area thereof; and wherein the control system switches and drives the first field diaphragm and the second field diaphragm.

17. An exposure apparatus comprising:

a mask stage which holds a mask having a pattern and reciprocates in a first direction;

a substrate movement mechanism which holds a substrate and moves the substrate to a second direction along a surface of the substrate;

a control system which synchronously drives the mask stage and the substrate movement mechanism;

a first projection optical system which projects an image of a first pattern of the mask, which is moved to one side of the first direction by the mask stage, onto the substrate as an erected image with respect to the second direction; and a second projection optical system which projects an image of a second pattern of the mask, which is moved to the other side of the first direction by the mask stage, onto the substrate as an inverted image with respect to the second direction, wherein the first and second projection optical systems include a common optical system, first and second optical systems, and a switching optical system which guides a luminous flux from the common optical system to the first optical system or the second optical system;

wherein the control system guides the luminous flux from the common optical system to the first optical system via the switching optical system, while the first projection optical system is used; and wherein the control system guides the luminous flux from the common optical system to the second optical system via the switching optical system, while the second projection optical system is used.

18. The exposure apparatus according to claim 17, wherein the optical axes of the first optical system and the second optical system are orthogonal to each other.

19. The exposure apparatus according to claim 15, wherein the mask stage moves the mask in a direction intersecting the first direction while the mask is reciprocating.

20. The exposure apparatus according to claim 15, wherein a magnification of the first and second projection optical systems from the mask to the substrate is at least 2× magnification.

21. The exposure apparatus according to claim 15, wherein the substrate movement mechanism includes a mechanism which winds up the substrate.

22. The exposure apparatus according to claim 15, wherein the first pattern and the second pattern of the mask are inverted with respect to the first direction.

23. The exposure apparatus according to claim 15, wherein the first and second projection optical systems include a plurality of partial projection optical systems which project images of patterns in a plurality of illumination areas of the mask onto the substrate, in which the plurality of illumination areas are arranged in a direction intersecting the first direction.

24. The exposure apparatus according to claim 15, wherein the control system exposes a first area of the substrate via a first pattern of the mask and the first projection optical system, while synchronizing a movement of the mask stage and a movement of the substrate to the second direction by the substrate movement mechanism, during a first period in which the mask stage is moved to one side along the first direction; and the control system exposes a second area of the substrate via a second pattern of the mask and the second projection optical system, while synchronizing a movement of the mask stage and a movement of the substrate to the second direction by the substrate movement mechanism, during a second period in which the mask stage is moved to the other side along the first direction.

25. A method for fabricating a device comprising:

exposing a photosensitive substrate using an exposure apparatus according to claim 15; and processing the exposed photosensitive substrate.

26. A method for fabricating a device comprising:

exposing a photosensitive substrate using an exposure method according to claim 13; and processing the exposed photosensitive substrate.

27. An exposure method for projecting an image of a pattern of a mask onto a substrate and exposing the substrate, the method comprising:

reciprocating the mask along a first direction, wherein the mask includes first and second pattern areas disposed along or orthogonal to the first direction;

synchronizing a movement of the mask and a movement of the substrate to a second direction along a surface of the substrate;

projecting an image of the first pattern area of the mask onto the substrate as an erected image with respect to the second direction during a first period in which the mask is moving to one side of the first direction so as to locate a portion of the first pattern area in a first illumination area; and projecting an image of the second pattern area of the mask onto the substrate as an inverted image with respect to the second direction during a second period in which the mask is moving to the other side of the first direction so as to locate a portion of the second pattern area in a second illumination area, wherein an illumination light is alternatively provided to the first illumination area on the mask during the first period and to the second illumination area on the mask during the second period.

28. The exposure method according to claim 27, wherein a first optical path of the illumination light toward the first illumination area opens during the first period and closes during the second period, and a second optical path of the illumination light toward the second illumination area opens during the second period and closes during the first period.

29. The exposure method according to claim 27, wherein the first pattern area and the second pattern area of the mask are arranged so as to be shifted in a direction intersecting the first direction; and the exposure method comprises moving the mask in the direction intersecting the first direction between the first period and the second period.

30. The exposure method according to claim 27, wherein a magnification of the erected image and the inverted image is at least 2× magnification; and the first pattern area and the second pattern area of the mask are arranged alternately in a direction intersecting the first direction.

31. The exposure method according to claim 27, further comprising:
  winding up the substrate by moving the substrate in the second direction, wherein the substrate is flexible.

32. The exposure method according to claim 27, wherein a first pattern formed in the first pattern area and a second pattern formed in the second pattern area of the mask are inverted with respect to the first direction.

33. The exposure method according to claim 27, further comprising:
  preparing the mask having a plurality of the first pattern areas and a plurality of the second pattern areas, which are arranged in the first direction or in a direction intersecting the first direction.

34. The exposure method according to claim 33, wherein
  the erected image includes a plurality of images corresponding to each of the first pattern areas; and
  the inverted image includes a plurality of images corresponding to each of the second pattern areas.

* * * * *